(12) United States Patent
Hwang et al.

(10) Patent No.: US 10,651,828 B2
(45) Date of Patent: May 12, 2020

(54) FLIP-FLOP AND SEMICONDUCTOR SYSTEM INCLUDING THE SAME

(71) Applicant: SAMSUNG ELECTRONICS CO., LTD., Suwon-si, Gyeonggi-Do (KR)

(72) Inventors: Hyun-Chul Hwang, Suwon-si (KR); Ah-Reum Kim, Daegu (KR); Min-Su Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 184 days.

(21) Appl. No.: 15/623,412

(22) Filed: Jun. 15, 2017

(65) Prior Publication Data
US 2018/0123569 A1 May 3, 2018

(30) Foreign Application Priority Data
Oct. 31, 2016 (KR) .................. 10-2016-0143420

(51) Int. Cl.
*H03K 3/012* (2006.01)
*H03K 3/3562* (2006.01)
*H03K 3/356* (2006.01)
*H03K 19/21* (2006.01)

(52) U.S. Cl.
CPC ......... *H03K 3/012* (2013.01); *H03K 3/35625* (2013.01); *H03K 3/356104* (2013.01); *H03K 3/356121* (2013.01); *H03K 19/21* (2013.01)

(58) Field of Classification Search
CPC .... H03K 3/01; H03K 3/012; H03K 3/356104; H03K 3/365113; H03K 3/365121; H03K 3/36513; H03K 3/365139; H03K 3/365182; H03K 3/365191; H03K 3/36525;
(Continued)

(56) References Cited

U.S. PATENT DOCUMENTS 6,448,831 B1   9/2002   Hunt, Jr. et al.
6,977,528 B2   12/2005  Kang et al.
(Continued)

FOREIGN PATENT DOCUMENTS

JP   2000077983   3/2000
JP   2006229826   8/2006
(Continued)

*Primary Examiner* — Lincoln D Donovan
*Assistant Examiner* — Diana J. Cheng
(74) *Attorney, Agent, or Firm* — Volentine, Whitt & Francos, PLLC

(57) ABSTRACT

A flip-flop generates a first feedback signal using a signal generated inside the flip-flop. The flip-flop includes a first stage circuit, a second stage circuit and a third stage circuit. The first stage circuit receives a first data signal and a clock signal and generates a first internal signal through a first node. The second stage circuit receives the first internal signal, the clock signal, and the first feedback signal and generates a second internal signal through a second node. The third stage circuit generates a second data signal by latching the second internal signal when the clock signal is at a first level, using the second internal signal and the clock signal. The second stage circuit cuts off at least one first current path between the second node and a power supply, based on the first feedback signal, when the clock signal is at a second level.

14 Claims, 28 Drawing Sheets

(58) Field of Classification Search
CPC .... H03K 19/21; H03K 19/212; H03K 19/215; H03K 19/217
See application file for complete search history.

(56) References Cited

U.S. PATENT DOCUMENTS 7,772,906 B2    8/2010  Naffziger
7,804,326 B1 *  9/2010  Chen ................ H03K 3/356104
                                                        326/68

FOREIGN PATENT DOCUMENTS

KR    1020030010246    2/2003
KR       100376915     3/2003

* cited by examiner

Table 1

| NET1 | CK | NET2 | Q |
|---|---|---|---|
| 0 | 0 | 1 | Previous value |
| 1 | 1 | 0 | 1 |
| 1 | 0 | 1 | Previous value |
| 0 | 1 | Previous value | 0 or 1 |

— Case 1 (second row)
— Case 2 (fourth row)

FIG. 2C
PRIOR ART

Table 2

| D | CK | NET1 |
|---|----|------|
| 0 | 0  | 1    |
| 1 | 1  | 0    |
| 1 | 0  | Previous value |
| 0 | 1  | Previous value | ←Case 3

FIG. 3A

Table 3

| NET1 | CK | NET2 |
|------|----|----|
| 0 | 0 | 1 |
| 1 | 1 | 0 |
| 1 | 0 | Previous value  ←—modified |
| 0 | 1 | Previous value |

FIG. 3B

| NET1 CK / NET2N | 00 | 01 | 11 | 10 |
|---|---|---|---|---|
| 0 | 1 | 1 | 0 | 1 |
| 1 | 1 | 0 | 0 | 0 |

<M_PUC2>

| NET2N NET3 \ NET1 CK | 00 | 01 | 11 | 10 |
|---|---|---|---|---|
| 00 | 1 | 1 | 0 | 1 |
| 01 | 1 | 1 | 0 | Don't care |
| 11 | 1 | 0 | 0 | 0 |
| 10 | 1 | Don't care | 0 | Don't care |

<M_PDC2>

| NET2N NET3 \ NET1 CK | 00 | 01 | 11 | 10 |
|---|---|---|---|---|
| 00 | 1 | 1 | 0 | 1 |
| 01 | 1 | Don't care | 0 | Don't care |
| 11 | 1 | 0 | 0 | 0 |
| 10 | 1 | Don't care | 0 | Don't care |

FIG. 11B

```
PUC2

NET2 = ($\overline{\text{NET1}}$ & $\overline{\text{CK}}$) | ($\overline{\text{NET1}}$ & $\overline{\text{NET2N}}$) | ($\overline{\text{CK}}$ & $\overline{\text{NET2N}}$ & $\overline{\text{NET3}}$) ---- ①
       | ($\overline{\text{CK}}$ & NET1 & $\overline{\text{NET2N}}$ & NET3) ---- ②
       | ($\overline{\text{CK}}$ & NET1 & $\overline{\text{NET3}}$ & NET2N) ---- ③
       | ($\overline{\text{NET1}}$ & CK & $\overline{\text{NET3}}$ & NET2N) ---- ④
```

```
PDC2

NET2 = ($\overline{\text{NET1}}$ & $\overline{\text{CK}}$) | ($\overline{\text{NET1}}$ & $\overline{\text{NET2N}}$ & $\overline{\text{NET3}}$) | ($\overline{\text{CK}}$ & $\overline{\text{NET2N}}$ & $\overline{\text{NET3}}$) ---- ⑤
       | ($\overline{\text{NET1}}$ & CK & $\overline{\text{NET2N}}$ & NET3) ---- ⑥
       | ($\overline{\text{CK}}$ & NET1 & $\overline{\text{NET2N}}$ & NET3) ---- ⑦
       | ($\overline{\text{NET1}}$ & CK & $\overline{\text{NET3}}$ & NET2N) ---- ⑧
       | ($\overline{\text{CK}}$ & NET1 & $\overline{\text{NET3}}$ & NET2N) ---- ⑨
```

FLIP-FLOP AND SEMICONDUCTOR SYSTEM INCLUDING THE SAME

CROSS-REFERENCE TO RELATED APPLICATION

This U.S. non-provisional patent application claims priority under 35 U.S.C. § 119 to Korean Patent Application No. 10-2016-0143420, filed on Oct. 31, 2016 in the Korean Intellectual Property Office, the disclosure of which is incorporated herein in its entirety by reference.

BACKGROUND

The present disclosure relates to a flip-flop. More particularly, the present disclosure relates to a semiconductor system including a flip-flop.

Along with the development of an integrated circuit (IC), there is a prominent trend of producing ultrasmall, highly-reliable, high-speed, and low-power electronics including computers. In addition, due to the improvement in degree of integration, the complexity of an integrated circuit gradually increases. For example, 100,000 or more transistors may be integrated into one chip of a very large scale integrated circuit (VLSI). Thus, the design of such a complex integrated circuit is considered an important factor affecting the performance of the integrated circuit.

In particular, standard cells are used as pre-made logic devices to improve the efficiency in the design of application specific integrated circuits (ASICs). A standard cell includes multiple transistors and provides a logic function (AND, OR, XOR, XNOR, or the like) or a storage function (flip-flop, latch, or the like). In addition, a standard cell library may be configured by collecting individual standard cells that perform different functions.

Here, a flip-flop that performs a storage function is a basic circuit capable of maintaining one-bit information in two stable states using a structure of feeding delayed output for input back to the input. Basically, there are various flip-flops such as a D flip-flop, an RS flip-flop, a JK flip-flop, a T flip-flop, and the like.

SUMMARY

The present disclosure provides a flip-flop capable of reducing power consumption upon latching an input data signal depending upon a clock signal, and a semiconductor system including the flip-flop.

According to an aspect of the present disclosure, a flip-flop generates a first feedback signal using a signal generated inside the flip-flop. The flip-flop includes a first stage circuit, a second stage circuit, and a third stage circuit. The first stage circuit receives a first data signal and a clock signal and generates a first internal signal through a first node. The second stage circuit receives the first internal signal, the clock signal, and the first feedback signal and generates a second internal signal through a second node. The third stage circuit generates a second data signal by latching the second internal signal when the clock signal is at a first level, using the second internal signal and the clock signal. The second stage circuit cuts off at least one first current path between the second node and a power supply, based on the first feedback signal, when the clock signal is at a second level.

According to another aspect of the present disclosure, a flip-flop is connected to a power supply and a ground and generates a second data signal by receiving a first data signal and a clock signal from outside of the flip-flop. The flip-flop includes a first stage circuit, a second stage circuit, and a third stage circuit. The first stage circuit generates a first internal signal through a first node using the first data signal and the clock signal. The second stage circuit generates a second internal signal through a second node using the first internal signal, the clock signal, and a feedback signal that is generated using the first internal signal. The third stage circuit generates the second data signal by latching the second internal signal using the second internal signal and the clock signal. The first stage circuit receives the feedback signal and prevents the first node from floating by grounding the first node or connecting the first node to the power supply, based on the feedback signal.

BRIEF DESCRIPTION OF THE DRAWINGS

Embodiments of the present disclosure will be more clearly understood from the following detailed description taken in conjunction with the accompanying drawings in which:

FIG. 2A is a circuit diagram which illustrates a general flip-flop, and FIGS. 2B to 2C are tables which illustrate characteristics of the general flip-flop in FIG. 2A;

FIG. 3A is a table illustrating operations of a flip-flop capable of effectively reducing power consumption, according to an embodiment;

FIG. 3B is a Karnaugh map illustrating the relationship between signals relating to a second stage circuit of a flip-flop according to an embodiment;

FIG. 11A shows Karnaugh maps illustrating the relationship between signals relating to a second stage circuit of a flip-flop according to an embodiment, and FIG. 11B shows relational expressions for a second internal signal derived from the Karnaugh maps of FIG. 11A.

DETAILED DESCRIPTION OF THE EMBODIMENTS

Hereinafter, embodiments of the present disclosure will be described in detail with reference to the accompanying drawings.

Figure 1A:
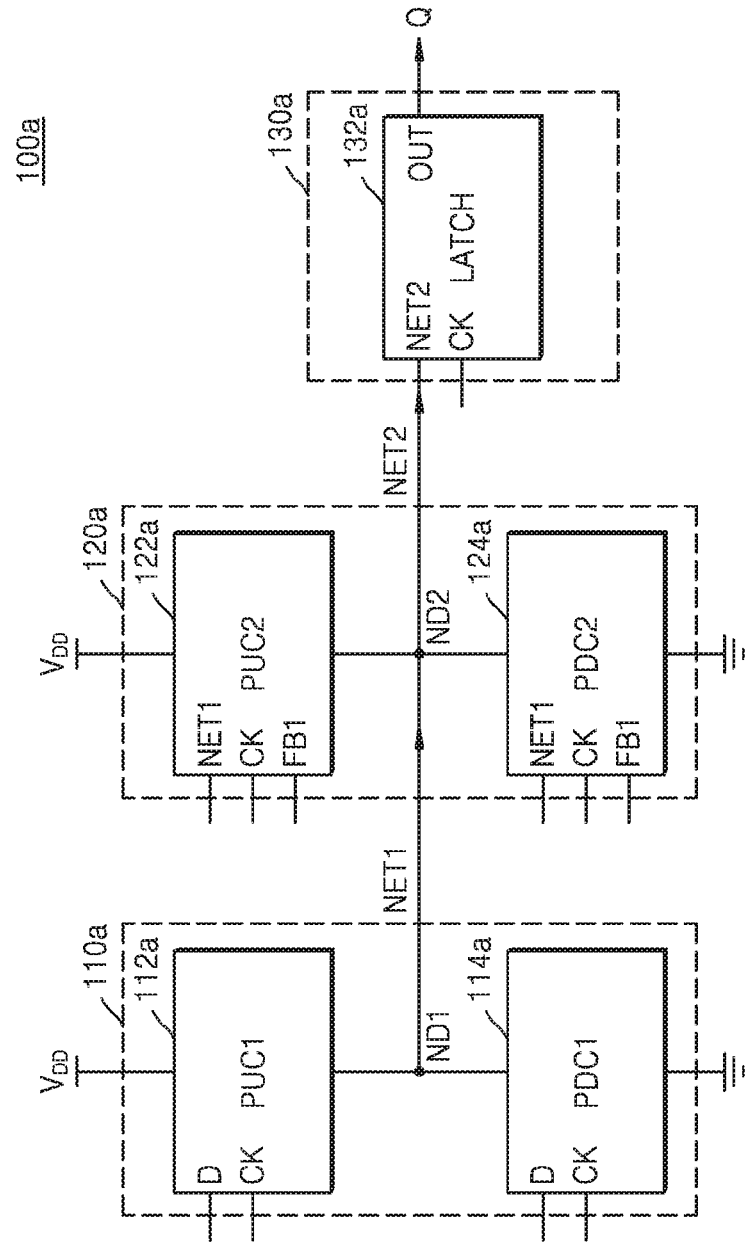
FIG. 1A is a block diagram of a flip-flop according to an embodiment.

FIG. 1A is a block diagram of a flip-flop according to an embodiment.

Referring to FIG. 1A, a flip-flop 100a may include a first stage circuit 110a, a second stage circuit 120a, and a third stage circuit 130a. The first stage circuit 110a may include a first pull-up circuit (pull-up circuit 1, PUC1) 112a and a first pull-down circuit (pull-down circuit 1, PDC1) 114a. The first pull-up circuit 112a may be connected between a power supply $V_{DD}$ and a first node ND1. The first pull-down circuit 114a may be connected between the first node ND1 and a ground GND.

In an embodiment, the first pull-up circuit 112a and the first pull-down circuit 114a may generate a first internal signal NET1 through the first node ND1. The first pull-up circuit 112a may receive a first data signal D and a clock signal CK. The first data signal D may be referred to as an input data signal received by the flip-flop 100a. The first pull-up circuit 112a may precharge the first node ND1 with the power supply $V_{DD}$ by forming at least one current path between the power supply $V_{DD}$ and the first node ND1, based on the first data signal D and the clock signal CK. The first stage circuit 110a may provide the first internal signal NET1 at a high level to the second stage circuit 120a through the precharged first node ND1. The first pull-down circuit 114a may receive the first data signal D and the clock signal CK. The first pull-down circuit 114a may discharge the first node ND1 by forming at least one current path between the first node ND1 and the ground GND, based on the first data signal D and the clock signal CK. The first stage circuit 110a may provide the first internal signal NET1 at a low level to the second stage circuit 120a through the discharged first node ND1.

In an embodiment, the second stage circuit 120a may include a second pull-up circuit 122a and a second pull-down circuit 124a. The second pull-up circuit 122a may be connected between the power supply $V_{DD}$ and a second node ND2. The second pull-down circuit 124a may be connected between the second node ND2 and the ground GND. The second pull-up circuit 122a and the second pull-down circuit 124a may generate a second internal signal NET2 through the second node ND2. The second pull-up circuit 122a may receive the first internal signal NET1, the clock signal CK, and a first feedback signal FB1. The second pull-up circuit 122a may precharge the second node ND2 with the power supply $V_{DD}$ by forming at least one current path between the power supply $V_{DD}$ and the second node ND2, based on the first internal signal NET1, the clock signal CK, and the first feedback signal FB1. The second stage circuit 120a may provide the second internal signal NET2 at the high level to the third stage circuit 130a through the precharged second node ND2. The second pull-down circuit 124a may discharge the second node ND2 by forming at least one current path between the second node ND2 and the ground GND, based on the first internal signal NET1, the clock signal CK, and the first feedback signal FB1. The second stage circuit 120a may provide the second internal signal NET2 at the low level to the third stage circuit 130a through the discharged second node ND2.

In addition, in an embodiment, to reduce power consumption when the second stage circuit 120a generates the second internal signal NET2, the second pull-up circuit 122a may cut off the at least one current path between the power supply $V_{DD}$ and the second node ND2, based on the first feedback signal FB1. Specifically, the second pull-up circuit 122a may include a switch device controlled to be turned on/off by the first feedback signal FB1. The second pull-up circuit 122a may turn off the switch device to cut off the at least one current path between the power supply $V_{DD}$ and the second node ND2. That is, the second pull-up circuit 122a allows the second node ND2 not to be electrically connected to the power supply $V_{DD}$, based on the first feedback signal FB1, thereby preventing an unnecessary precharge operation. This may lead to an effect of reducing the power consumption of the flip-flop 100a. In an embodiment, the first feedback signal FB1 may include a signal generated using an output signal NET2 of the second stage circuit 120a. Further, the first feedback signal FB1 may further include a signal generated using an output signal Q of the third stage circuit 130a.

In another embodiment, when the second stage circuit 120a generates the second internal signal NET2, for the second node ND2 not to float, the second pull-up circuit 122a may form the at least one current path between the power supply $V_{DD}$ and the second node ND2, based on the first internal signal NET1 and the first feedback signal FB1. When the second internal signal NET2 is at the high level, the second node ND2 may always be electrically connected to the power supply $V_{DD}$. In addition, the second pull-down circuit 124a may form the at least one current path between the second node ND2 and the ground GND, based on the clock signal CK and the first feedback signal FB1. When the second internal signal NET2 is at the low level, the second node ND2 may always be electrically connected to the ground GND. That is, when the second stage circuit 120a generates the second internal signal NET2, the second node ND2 may always be connected to the power supply $V_{DD}$ or the ground GND, thereby preventing the second node ND2 from floating. As a result, the flip-flop 100a may be made resistant to noise.

The third stage circuit 130a may include a latch circuit 132a. The latch circuit 132a may receive the second internal signal NET2 and the clock signal CK. The latch circuit 132a may generate a second data signal Q by latching the second internal signal NET2 depending upon the clock signal CK. The second data signal Q may be referred to as an output data signal that is output by the flip-flop 100a. In an embodiment, the latch circuit 132a may latch the second internal signal NET2 when the clock signal CK is at the high level. The second stage circuit 120a may cut off the at least one current path between the power supply $V_{DD}$ and the second node ND2, based on the first feedback signal FB1, when the clock signal CK is at the low level. The latch circuit 132a may output the latched second internal signal NET2 as the second data signal Q. Although the third stage circuit 130a is schematically shown as including the latch circuit 132a for convenience in FIG. 1A, the third stage circuit is not limited thereto. Like the first stage circuit 110a and the second stage circuit 120a, the third stage circuit 130a may be variously realized to include a pull-up circuit and a pull-down circuit.

Figure 1B:
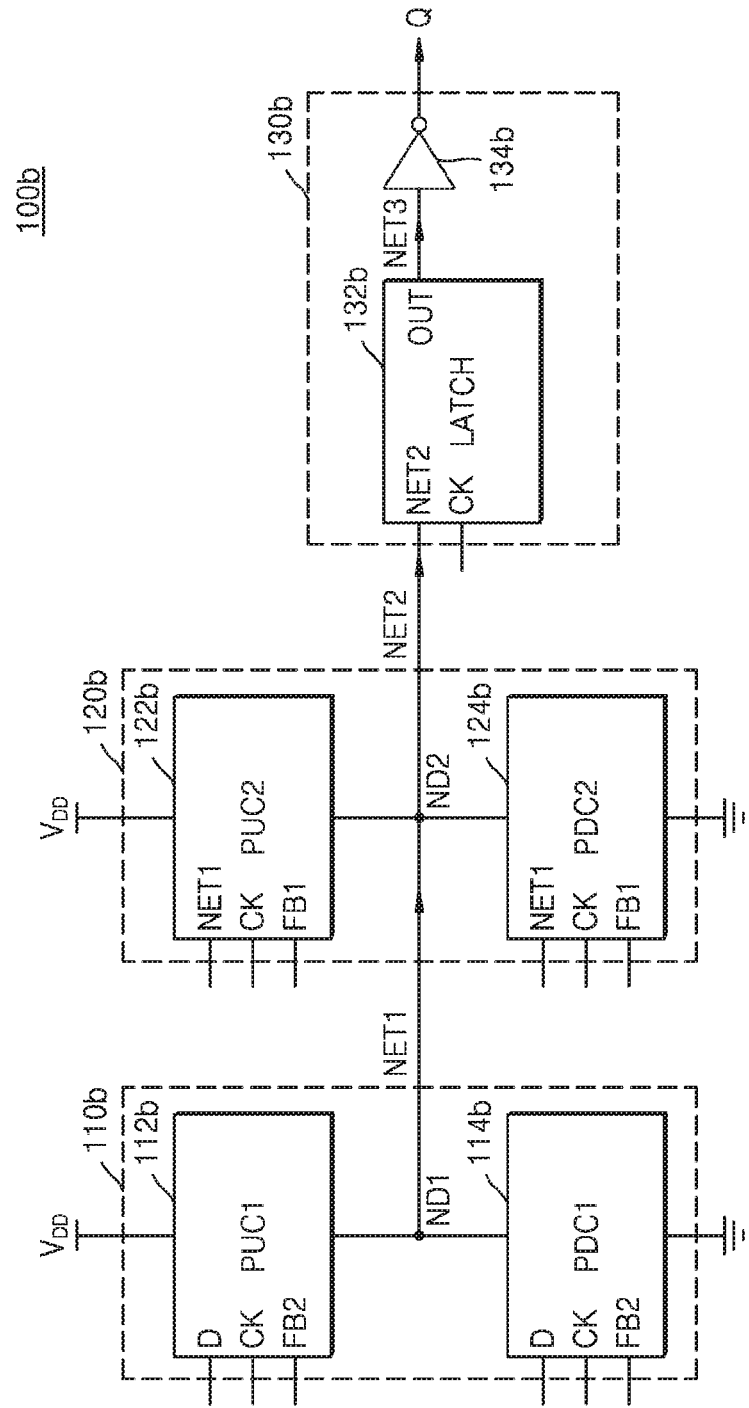
FIG. 1B is a block diagram of a flip-flop according to another embodiment.

FIG. 1B is a block diagram of a flip-flop according to another embodiment.

Referring to FIG. 1B, a flip-flop 100b may include a first stage circuit 110b, a second stage circuit 120b, and a third stage circuit 130b. Among components shown in FIG. 1B, the first stage circuit 110b and the third stage circuit 130b, which are different from those in FIG. 1A, will be mainly described hereinafter.

The first stage circuit 110b may include a first pull-up circuit 112b and a first pull-down circuit 114b. The first pull-up circuit 112b and the first pull-down circuit 114b may generate the first internal signal NET1 through the first node ND1. The first pull-up circuit 112b may receive the first data signal D, the clock signal CK, and a second feedback signal FB2. In an embodiment, when the first internal signal NET1 is at the high level, for the first node ND1 to always be electrically connected to the power supply $V_{DD}$, the first pull-up circuit 112b may form at least one current path between the power supply $V_{DD}$ and the first node ND1, based on the first data signal D and the second feedback signal FB2. When the first internal signal NET1 is at the high level, the first node ND1 may always be electrically connected to the power supply $V_{DD}$. In addition, when the first internal signal NET1 is at the low level, for the first node ND1 to always be electrically connected to the ground GND, the first pull-down circuit 114b may form at least one current path between the first node ND1 and the ground GND, based on the clock signal CK and the second feedback signal FB2. When the first internal signal NET1 is at the low level, the first node ND1 may always be electrically connected to the ground GND. By this configuration, when the first stage circuit 110b generates the first internal signal NET1, the first node ND1 may always be connected to the power supply $V_{DD}$ or the ground GND, thereby preventing the first node ND1 from floating. As a result, the flip-flop 100b may be made resistant to noise. In an embodiment, the second feedback signal FB2 may include a signal generated using an output signal NET1 of the first stage circuit 110b.

The third stage circuit 130b may include a latch circuit 132b and an inverter 134b. The latch circuit 132b may receive the second internal signal NET2 and the clock signal CK. The latch circuit 132b may generate a third internal signal NET3 by latching the second internal signal NET2 depending upon the clock signal CK. The inverter 134b may generate the second data signal Q by inverting the third internal signal NET3. However, a configuration shown in FIG. 1B is merely an example, and the third stage circuit 130b may include multiple buffers to improve driving capabilities of the third stage circuit 130b with respect to the second data signal Q.

Figures 2A, 2B:
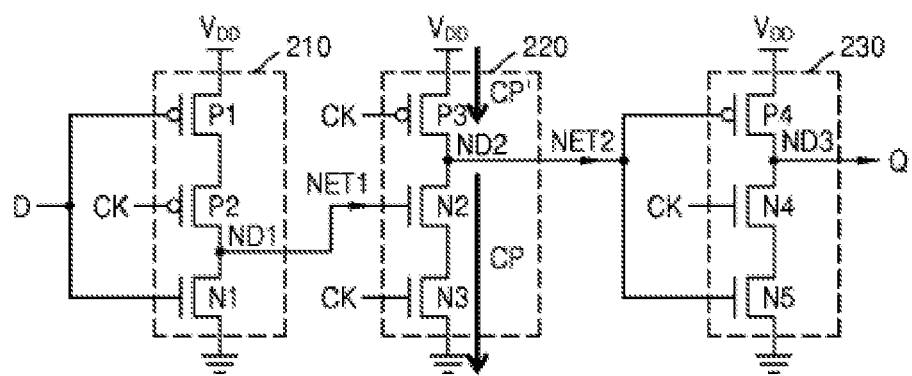

FIG. 2A is a circuit diagram which illustrates a general flip-flop, and FIGS. 2B to 2C are tables which illustrate characteristics of the general flip-flop in FIG. 2A.

Referring to FIG. 2A, a general flip-flop 200 may include a first stage circuit 210, a second stage circuit 220, and a third stage circuit 230. The first stage circuit 210 may include a transistor P1, a transistor P2, and a transistor N1. The first stage circuit 210 may receive the first data signal D and the clock signal CK and generate the first internal signal NET1 through the first node ND1 between the transistor P2 and the transistor N1, based on the first data signal D and the clock signal CK. The second stage circuit 220 may include a transistor P3, a transistor N2, and a transistor N3. The second stage circuit 220 may receive the first internal signal NET1 and the clock signal CK and generate the second internal signal NET2 through the second node ND2 between the transistor P3 and the transistor N2, based on the first internal signal NET1 and the clock signal CK. The third stage circuit 230 may include a transistor P4, a transistor N4, and a transistor N5. The third stage circuit 230 may receive the second internal signal NET2 and the clock signal CK and generate the second data signal Q through a third node ND3 between the transistor P4 and the transistor N4, based on the second internal signal NET2 and the clock signal CK.

Referring to FIGS. 2A and 2B, Table 1 shows the relationship between levels of the first internal signal NET1, the clock signal CK, the second internal signal NET2, and the second data signal Q of FIG. 2A.

First, the case that an unnecessary precharge operation occurs at the second node ND2 in the second stage circuit 220 will be described with reference to Case 1. When the first internal signal NET1 is at the high level and the clock signal CK is at the high level, the transistor P3 of the second stage circuit 220 is turned off, and the transistor N2 and the transistor N3 are turned on, whereby a current path CP may be formed between the second node ND2 and the ground GND. Thus, the second node ND2 is discharged, whereby the second stage circuit 220 may generate the second internal NET2 at the low level through the second node ND2. When the second internal signal NET2 is at the low level and the clock signal CK is at the high level, the transistor P4 of the third stage circuit 230 is turned on, and the transistor N4 and the transistor N5 are turned off, whereby a current path may be formed between the third node ND3 and the power supply $V_{DD}$. Thus, the third node ND3 is precharged, whereby the third stage circuit 230 may generate the second data signal Q at the high level through the third node ND3.

Next, when the first internal signal NET1 maintains the high level and the clock signal CK transits from the high level to the low level, the transistor P3 of the second stage circuit 220 is turned on, and the transistor N2 and the transistor N3 are turned off, whereby a current path CP' may be formed between the power supply $V_{DD}$ and the second node ND2. Thus, the second node ND2 is precharged, whereby the second stage circuit 220 may generate the second internal signal NET2 at the high level through the second node ND2. When the second internal signal NET2 is at the high level and the clock signal is at the low level, since the transistor P4 and the transistor N4 of the third stage circuit 230 are turned off, the third node ND3 may maintain a previous precharge state. Thus, the third stage circuit 230 may output the second data signal Q maintaining the high level through the third node ND3 even when the clock signal CK transits from the high level to the low level.

Next, when the first internal signal NET1 maintains the high level and the clock signal CK transits from the low level to the high level, the current path CP is formed again between the second node ND2 and the ground GND in the second stage circuit 220, whereby the second node ND2 may be discharged. Even in this case, the second data signal Q output by the third stage circuit 230 may still maintain the high level.

As such, upon the operation of the general flip-flop 200, even though the second data signal Q is maintained at a constant level, since unnecessary precharge operations and/or discharge operations are repeated, there is a problem of an increase in the power consumption of the flip-flop 200.

The case that the second node ND2 of the second stage circuit 220 floats will be described with reference to Case 2. When the first internal signal NET1 is at the low level and the clock signal CK is at the high level, the transistor P3 and the transistor N2 of the second stage circuit 220 are turned off, whereby the second node ND2 may float.

The case that the first node ND1 of the first stage circuit 210 floats will be described with reference to FIGS. 2A and 2C. In Case 3 where the first data signal D is at the low level and the clock signal CK is at the high level, the transistor P2 and the transistor N1 of the first stage circuit 210 are turned off, whereby the first node ND1 may float.

In Case 2 and Case 3, the first node ND1 or the second node ND2 may float. In the general flip-flop 200, when the first node ND1 or the second node ND2 floats, a voltage level state of the first node ND1 or the second node ND2 may be changed by noise external or internal to the general flip-flop 200 due to the floating of the first node ND1 or the second node ND2. This results in a problem of the deterioration in the reliability of the operation of the flip-flop 200.

Figure 3C:
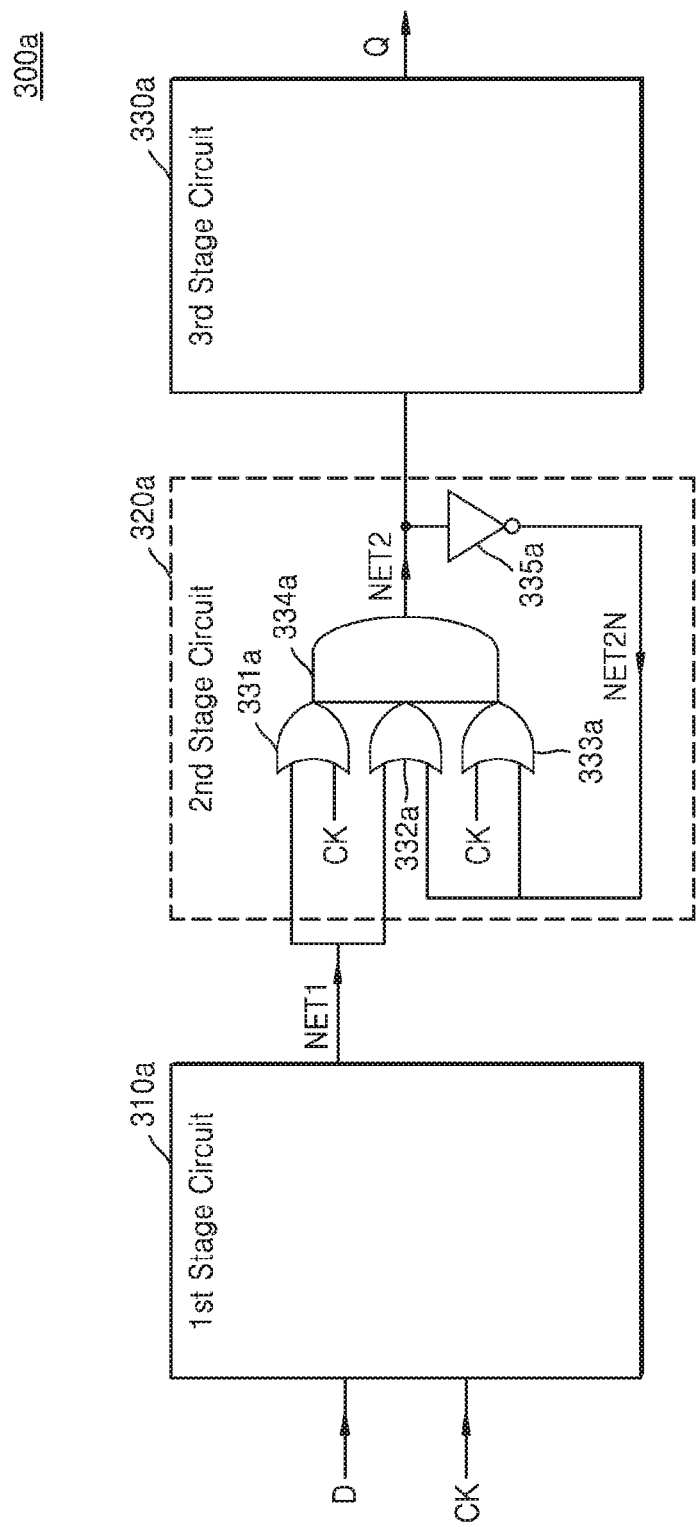
FIGS. 3C to 3E are block diagrams of flip-flops capable of performing the operations shown in the table of FIG. 3A, according to an embodiment.
Figure 3D:
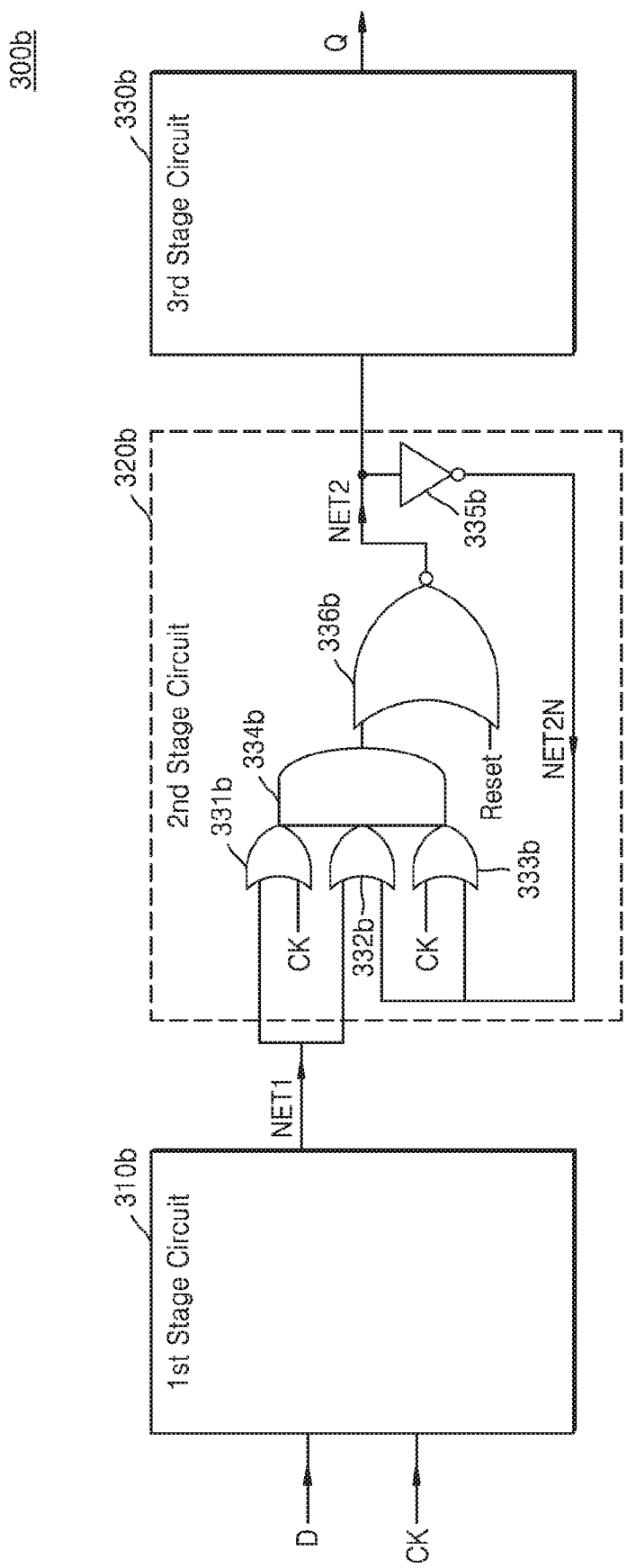
Figure 3E:
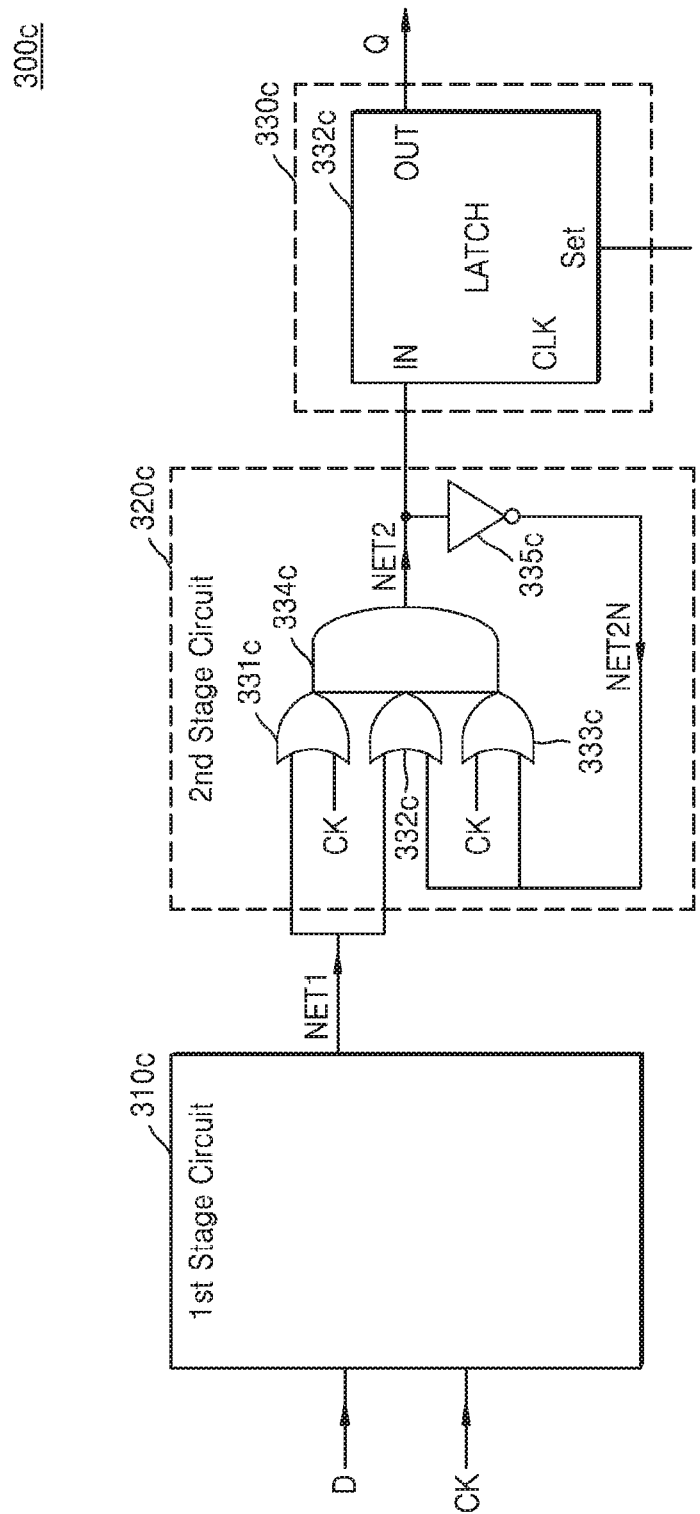

FIG. 3A is a table illustrating operations of a flip-flop capable of effectively reducing power consumption, according to an embodiment. FIG. 3B is a Karnaugh map illustrating the relationship between signals relating to a second stage circuit of a flip-flop according to an embodiment. FIGS. 3C to 3E are block diagrams of flip-flops capable of performing operations shown in the table of FIG. 3A, according to an embodiment.

Referring to FIG. 3A, when the first internal signal NET1 is at the high level and the clock signal CK is at the low level, a second stage circuit according to an embodiment may generate the second internal signal NET2 having a previous value, as compared with FIG. 2B. Thus, when the first internal signal NET1 and the clock signal CK are at the same level, the second stage circuit may output a signal corresponding to the first internal signal NET1 as the second internal signal NET2. For example, the second internal signal NET2 may be a signal obtained by inverting the first internal signal NET1. In addition, when the first internal signal NET1 and the clock signal CK are at different levels, the second stage circuit may output the second internal signal NET2 having the previous value. However, this is merely an example, and the output of the second stage circuit is not limited thereto. When the first internal signal NET1 and the clock signal CK are at different levels, the second stage circuit may output the signal corresponding to the first internal signal NET1 as the second internal signal NET2. When the first internal signal NET1 and the clock signal CK are at the same level, the second stage circuit may output the second internal signal NET2 having the previous value.

The second stage circuit according to an embodiment may cut off the current path CP' of FIG. 2A, which is formed when the first internal signal NET1 is at the high level and the clock signal CK is at the low level, thereby preventing an unnecessary precharge operation.

Referring to FIG. 3B, to satisfy operations of the second stage circuit, the relationship between signals NET1, CK, and NET2N relating to the second stage circuit may be established, like in a logic function in the form of a truth table shown in a Karnaugh map M. However, the Karnaugh map M shown in FIG. 3B is merely an example, without being limited thereto, and may vary depending upon a configuration of the second stage circuit. In an embodiment, as a result of minimizing the logic function of the Karnaugh map M of FIG. 3B, the relationship between the first internal signal NET1, the clock signal CK, and the second internal signal NET2 may be represented as follows.

NET2=(NET1|CK)&(NET1|NET2N)&(CK|NET2N)

Referring to FIG. 3C, a flip-flop 300a according to an embodiment may include a first stage circuit 310a, a second stage circuit 320a, and a third stage circuit 330a. To generate the second internal signal NET2 satisfying the above relationship, the second stage circuit 320a may include a first OR gate 331a, a second OR gate 332a, a third OR gate 333a, an AND gate 334a, and an inverter 335a. The first OR gate 331a may receive the first internal signal NET1 and the clock signal CK. The second OR gate 332a may receive the first internal signal NET1 and a feedback signal NET2N. The third OR gate 333a may receive the clock signal CK and the feedback signal NET2N. The AND gate 334a may receive an output signal of the first OR gate 331a, an output signal of the second OR gate 332a, and an output signal of the third OR gate 333a. The inverter 335a may receive the second internal signal NET2 from the AND gate 334a. The inverter 335a may generate the feedback signal NET2N by inverting the second internal signal NET2. The second stage circuit 320a may prevent an unnecessary precharge operation when generating the second internal signal NET2, based on the feedback signal NET2N, as described above.

Referring to FIG. 3D, a second stage circuit 320b may further include an XOR gate 336b compared to the second stage circuit 320a of FIG. 3C. The XOR gate 336b may receive an output signal of an AND gate 334b and receive a reset signal Reset from outside of the second stage circuit 320b. In an embodiment, the XOR gate 336b may output the second internal signal NET2 that is reset, when receiving the reset signal Reset at the high level.

Referring to FIG. 3E, a latch circuit 332c of a third stage circuit 330c may further receive a set signal Set, unlike a latch circuit of a third stage circuit 330a of FIG. 3C. In an embodiment, the latch circuit 332c may output the second data signal Q at a preset level, when receiving the set signal Set at the high level.

Figure 4A:
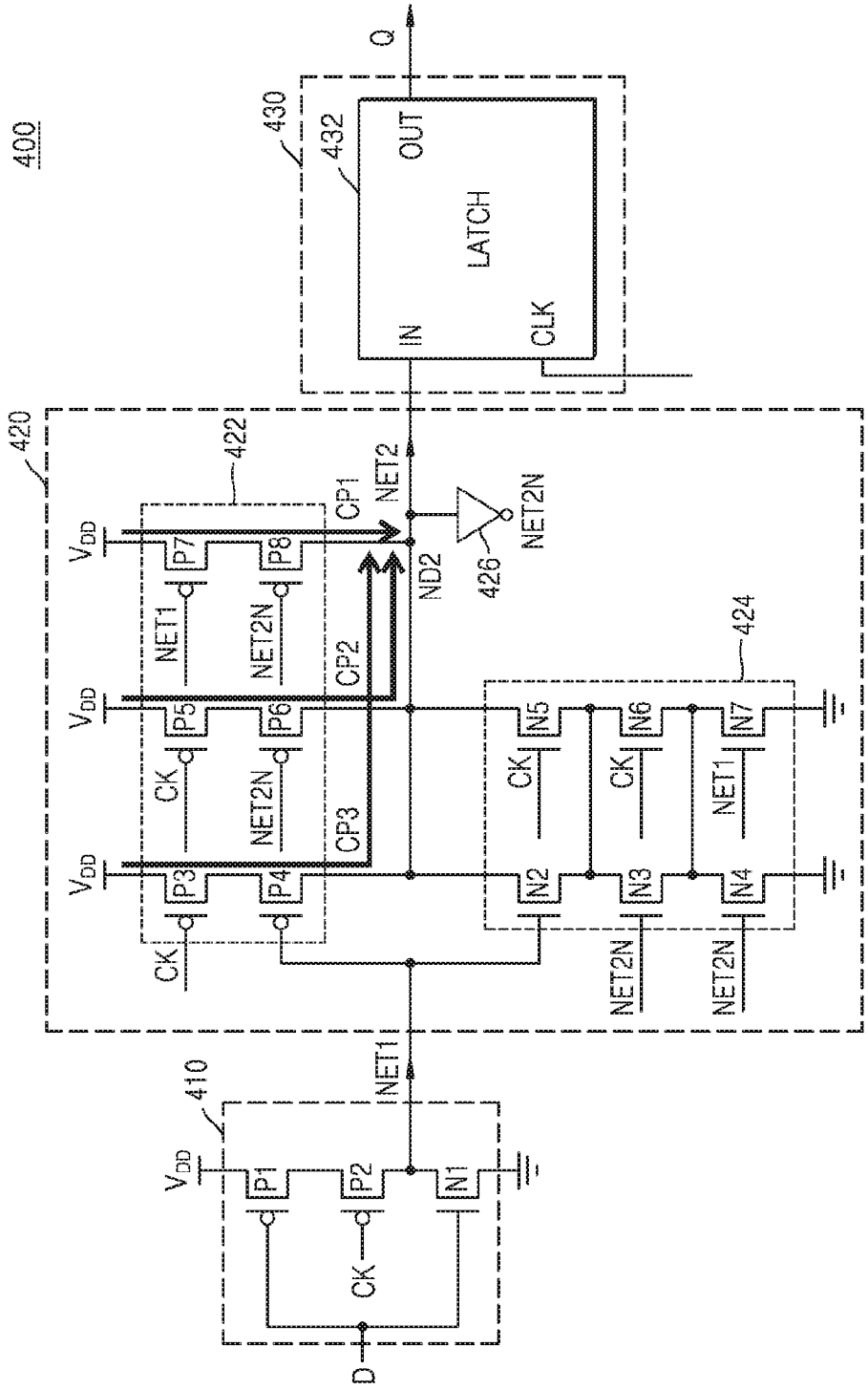
FIGS. 4A and 4C are circuit diagrams which each illustrate a flip-flop.
Figure 4B:
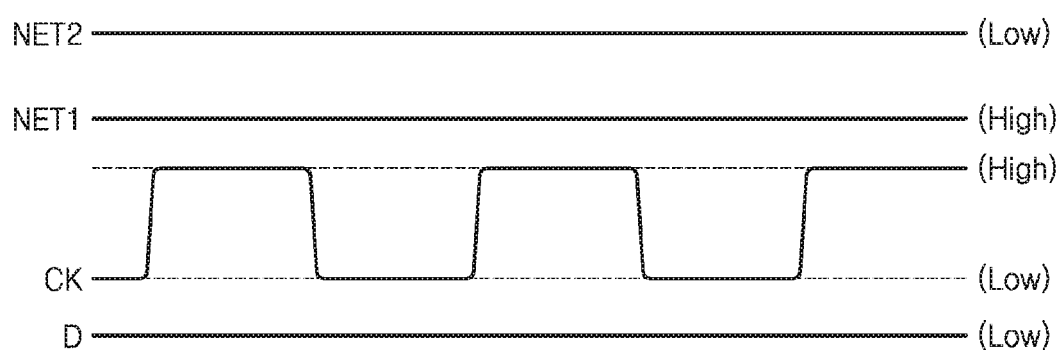
FIG. 4B is a graph which illustrates operations of a flip-flop according to an embodiment in order to solve the problem described with reference to FIG. 2B.
Figure 4C:
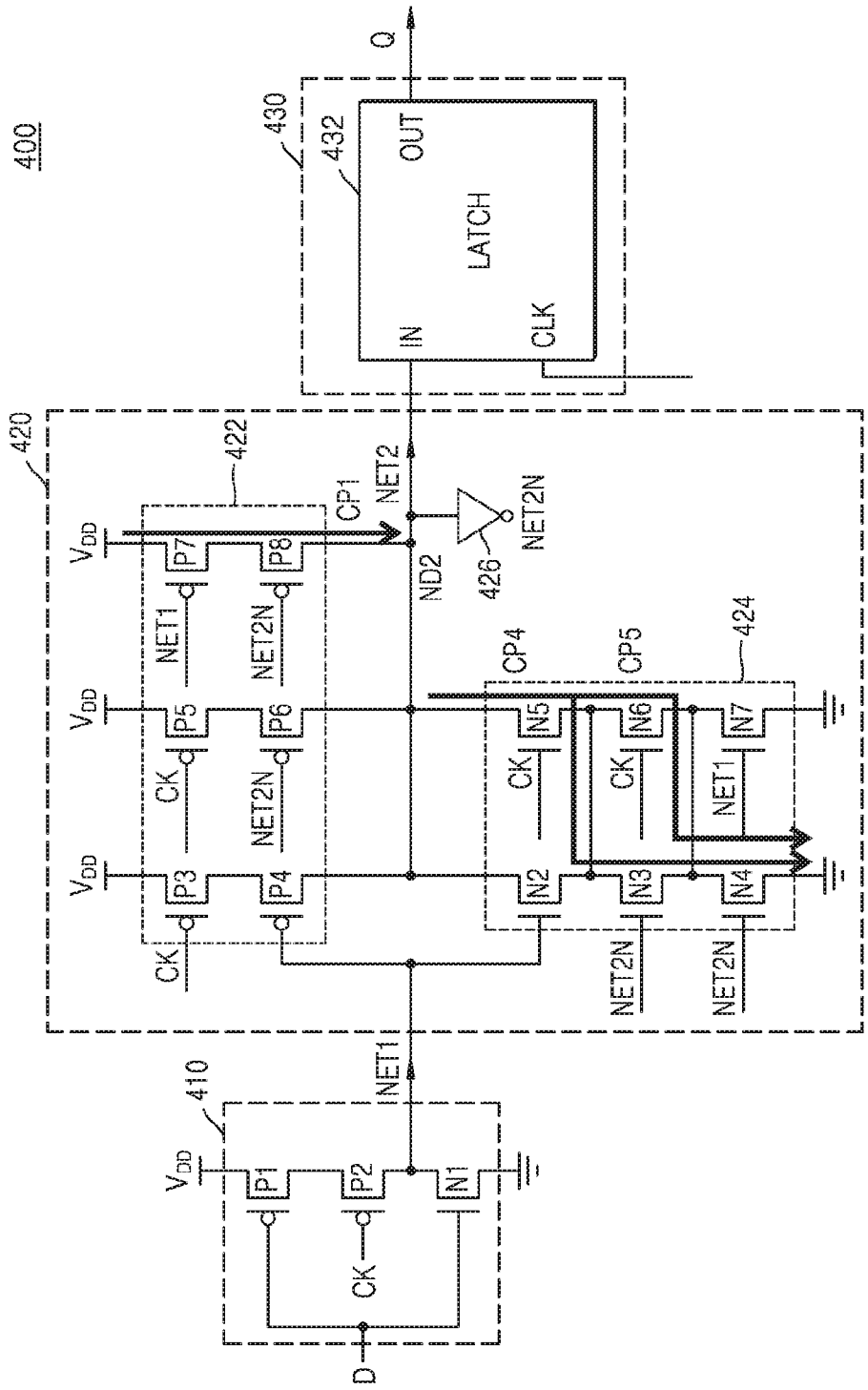

FIGS. 4A and 4C are circuit diagrams which each illustrate a flip-flop, and FIG. 4B is a graph which illustrates operations of a flip-flop according to an embodiment in order to solve the problem described with reference to FIG. 2B.

Referring to FIG. 4A, a flip-flop 400 may include a first stage circuit 410, a second stage circuit 420, and a third stage circuit 430. Since the first stage circuit 410 and the third stage circuit 430 respectively correspond to the first stage circuit 110a and the third stage circuit 130a, which have been described with reference to FIG. 1A, descriptions thereof will be omitted. The second stage circuit 420 may include a second pull-up circuit 422, a second pull-down circuit 424, and an inverter 426. The second pull-up circuit 422 may be connected between the power supply $V_{DD}$ and the second node ND2. The second pull-down circuit 424 may be connected between the second node ND2 and the ground GND. The second pull-up circuit 422 may include multiple PMOS transistors P3 to P8. The second pull-up circuit 422 may form multiple current paths CP1 to CP3 between the power supply $V_{DD}$ and the second node ND2 using the PMOS transistors P3 to P8. The second pull-down circuit 424 may include multiple NMOS transistors N2 to N7. The second pull-down circuit 424 may form multiple current paths using the NMOS transistors N2 to N7. However, this is merely an example, and the second pull-up circuit 422 and the second pull-down circuit 424 may include various kinds of transistors.

The second pull-up circuit 422 and the second pull-down circuit 424 may generate the second internal signal NET2 through the second node ND2. The inverter 426 may receive the second internal signal NET2 and generate the feedback signal NET2N.

In an embodiment, the transistor N5 and the transistor N6 of the second pull-down circuit 424 may be controlled to be turned on/off by the clock signal CK. The transistor N2 and the transistor N7 may be controlled to be turned on/off by the first internal signal NET1. The transistor N3 and the transistor N4 may be controlled to be turned on/off by the feedback signal NET2N. The transistor P3 and the transistor P5 of the second pull-up circuit 422 may be controlled to be turned on/off by the clock signal CK. The transistor P4 and the transistor P7 may be controlled to be turned on/off by the first internal signal NET1. The transistor P6 and the transistor P8 may be controlled to be turned on/off by the feedback signal NET2N. That is, a first current path CP1 and a second current path CP2, which are formed by the second pull-up circuit 422, may be cut off by the feedback signal NET2N.

Referring again to FIG. 3A, when the first internal signal NET1 is at the high level and the clock signal CK is at the high level, the second internal signal NET2 may be at the low level. Next, when the first internal signal NET1 maintains the high level and the clock signal CK transits from the high level to the low level, the second pull-up circuit 420 may cut off a current path, based on the feedback signal NET2N, thereby preventing an unnecessary precharge operation for the second node ND2. For example, since the feedback signal NET2N is at the high level although the transistor P5 is turned on by the clock signal CK that is at the low level, the transistor P6 is turned off, whereby the second current path CP2 may be cut off. By this configuration of the second pull-up circuit 422, the problem described with reference to Case 1 of FIG. 2B may be solved.

In addition, under the condition of the first internal signal NET1 at the low level, the clock signal CK at the high level, and the second internal signal NET2 at the low level, when the first internal signal NET1 maintains the low level and the clock signal CK transits to the low level, the transistor P3 and the transistor P4 are turned on, whereby a third current path CP3 may be formed. The second node ND2 may be precharged through the third current path CP3, and the second internal signal NET2 at the high level may be generated through the second node ND2.

Referring to FIG. 4B, when a first data signal D and the first internal signal NET1 are respectively at the low level and the high level and the clock signal CK cyclically transits between the high level and the low level, the second internal signal NET2 may be kept constant at the low level. That is, as described with reference to FIG. 4A, the second pull-up circuit 422 may cut off the second current path CP2 to prevent the second node ND2 from being unnecessarily precharged.

Referring to FIG. 4C, the second pull-up circuit 422 and the second pull-down circuit 424, according to an embodiment, may prevent the second node ND2 from floating. Referring again to FIG. 3A, when the first internal signal NET1, the clock signal CK, and the second internal signal NET2 are respectively at the low level, the high level, and the high level and the second node ND2 is precharged, the transistor P7 of the second pull-up circuit 422 is turned on by the first internal signal NET1, and the transistor P8 is turned on by the feedback signal NET2N that is at the low level, whereby the first current path CP1 may be formed between the power supply $V_{DD}$ and the second node ND2. Thus, the second node ND2 may be stably kept precharged by the second pull-up circuit 422.

In addition, when the first internal signal NET1, the clock signal CK, and the second internal signal NET2 are respectively at the low level, the high level, and the low level and the second node ND2 is discharged, the transistor N5 and the transistor N6 of the second pull-down circuit 424 are turned on by the clock signal CK, and the transistor N3 and the transistor N4 are turned on by the feedback signal NET2N that is at the high level, whereby a fourth current path CP4 and a fifth current path CP5 may be formed. Thus, the second node ND2 may be stably kept discharged by the second pull-down circuit 424.

By this configuration of the second pull-up circuit 422 and the second pull-down circuit 424, the problem described with reference to Case 2 of FIG. 2B may be solved.

Figure 5:
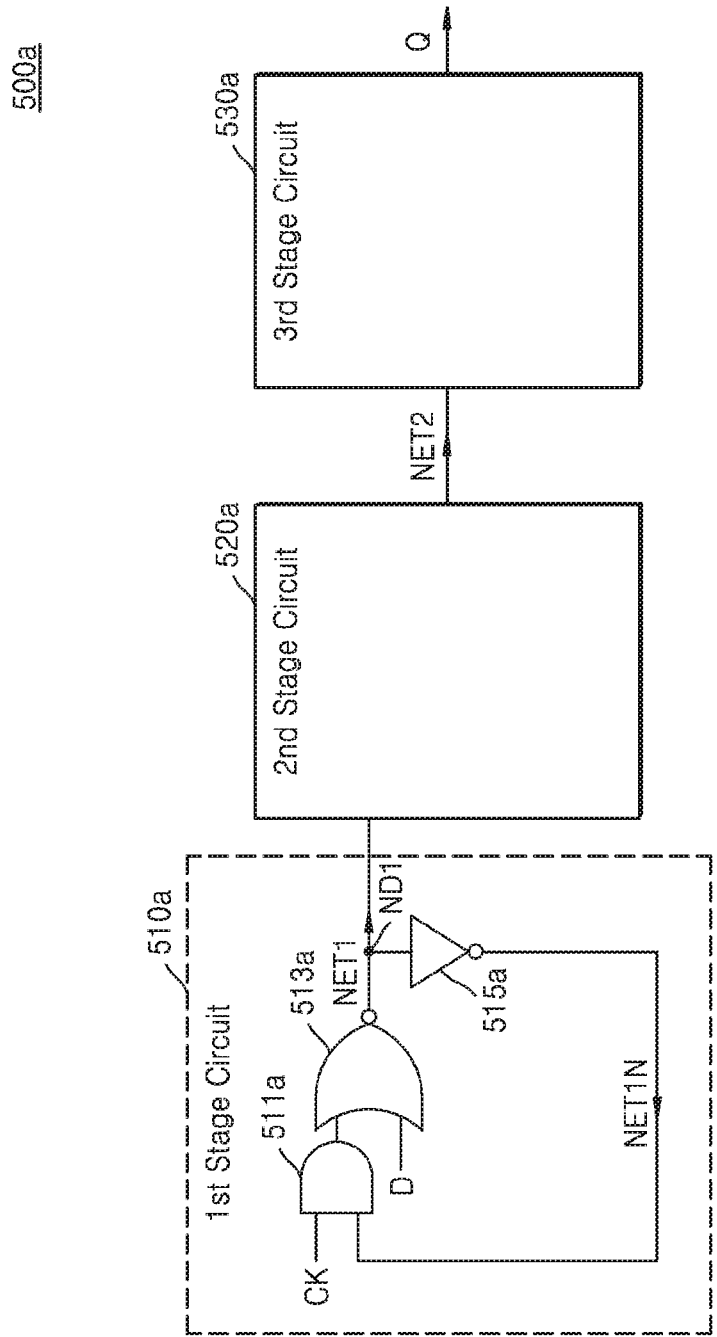
FIG. 5 is a block diagram of a flip-flop according to an embodiment in order to solve the problem described with reference to FIG. 2C.

FIG. 5 is a block diagram of a flip-flop according to an embodiment in order to solve the problem described with reference to FIG. 2C.

Referring to FIG. 5, a flip-flop 500a may include a first stage circuit 510a, a second stage circuit 520a, and a third stage circuit 530a. As described with reference to FIG. 2C, for the first node ND1 not to float, the first stage circuit 510a according to an embodiment may include an AND gate 511a, a NOR gate 513a, and an inverter 515a. The AND gate 511a may receive the clock signal CK and a feedback signal NET1N. The NOR gate 513a may receive an output signal of the AND gate 511a and the first data signal D. The inverter 515a may receive the first internal signal NET1 from the NOR gate 513a. The inverter 515a may generate the feedback signal NET1N by inverting the first internal signal NET1.

Figure 6:
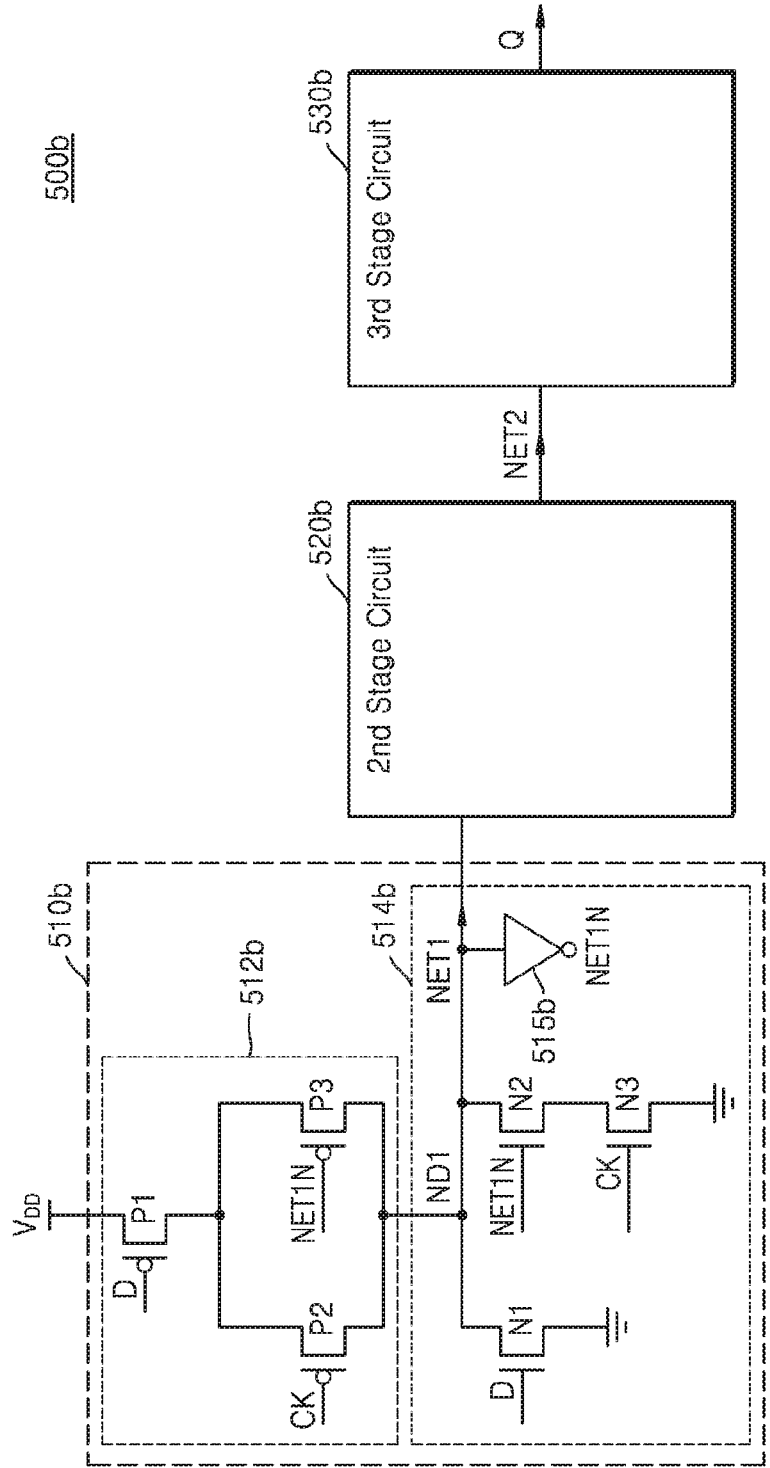
FIG. 6 is a circuit diagram illustrating a first stage circuit of FIG. 5, according to an embodiment, in detail.

FIG. 6 is a circuit diagram illustrating the first stage circuit of FIG. 5, according to an embodiment, in detail.

Referring to FIG. 6, a first stage circuit 510b according to an embodiment may include a first pull-up circuit 512b, a first pull-down circuit 514a, and an inverter 515b. The first pull-up circuit 512b may include multiple PMOS transistors P1 to P3, and may generate multiple current paths between the power supply $V_{DD}$ and the first node ND1 using the PMOS transistors P1 to P3. The first pull-down circuit 514a may include multiple NMOS transistors N1 to N3. The first pull-down circuit 514a may generate multiple current paths between the first node ND1 and the ground GND using the NMOS transistors N1 to N3. However, this is merely an example, and the first pull-up circuit 512b and the first pull-down circuit 514a may include various kinds of transistors.

The first pull-up circuit 512b and the first pull-down circuit 514a may generate the first internal signal NET1 through the first node ND1. The inverter 515b may receive the first internal signal NET1 and generate the feedback signal NET1N.

In an embodiment, the transistor P1 of the first pull-up circuit 512b may be controlled to be turned on/off by the first data signal D. The transistor P2 may be controlled to be turned on/off by the clock signal CK. The transistor P3 may be controlled to be turned on/off by the feedback signal NET1N. The transistor N1 of the first pull-down circuit 514a may be controlled to be turned on/off by the first data signal D. The transistor N2 may be controlled to be turned on/off by the feedback signal NET1N. The transistor N3 may be controlled to be turned on/off by the clock signal CK.

Referring again to FIG. 2C, when the first data signal D, the clock signal CK, and the first internal signal NET1 are respectively at the low level, the high level, and the high level and the first node ND1 is precharged, the transistor P1 of the first pull-up circuit 512b is turned on by the first data signal D, and the transistor P3 is turned on by the feedback signal NET1N that is at the low level, whereby a current path may be formed between the power supply $V_{DD}$ and the first node ND1. Thus, the first node ND1 may be stably kept precharged by the first pull-up circuit 512b.

In addition, when the first data signal D, the clock signal CK, and the first internal signal NET1 are respectively at the low level, the high level, and the low level and the first node ND1 is discharged, the transistor N2 of the first pull-down circuit 514b is turned on by the feedback signal NET1N that is at the low level, and the transistor N3 is turned on by the clock signal CK, whereby a current path may be formed between the first node ND1 and the ground GND. Thus, the first node ND1 may be stably kept discharged by the first pull-down circuit 514b.

Figure 7:
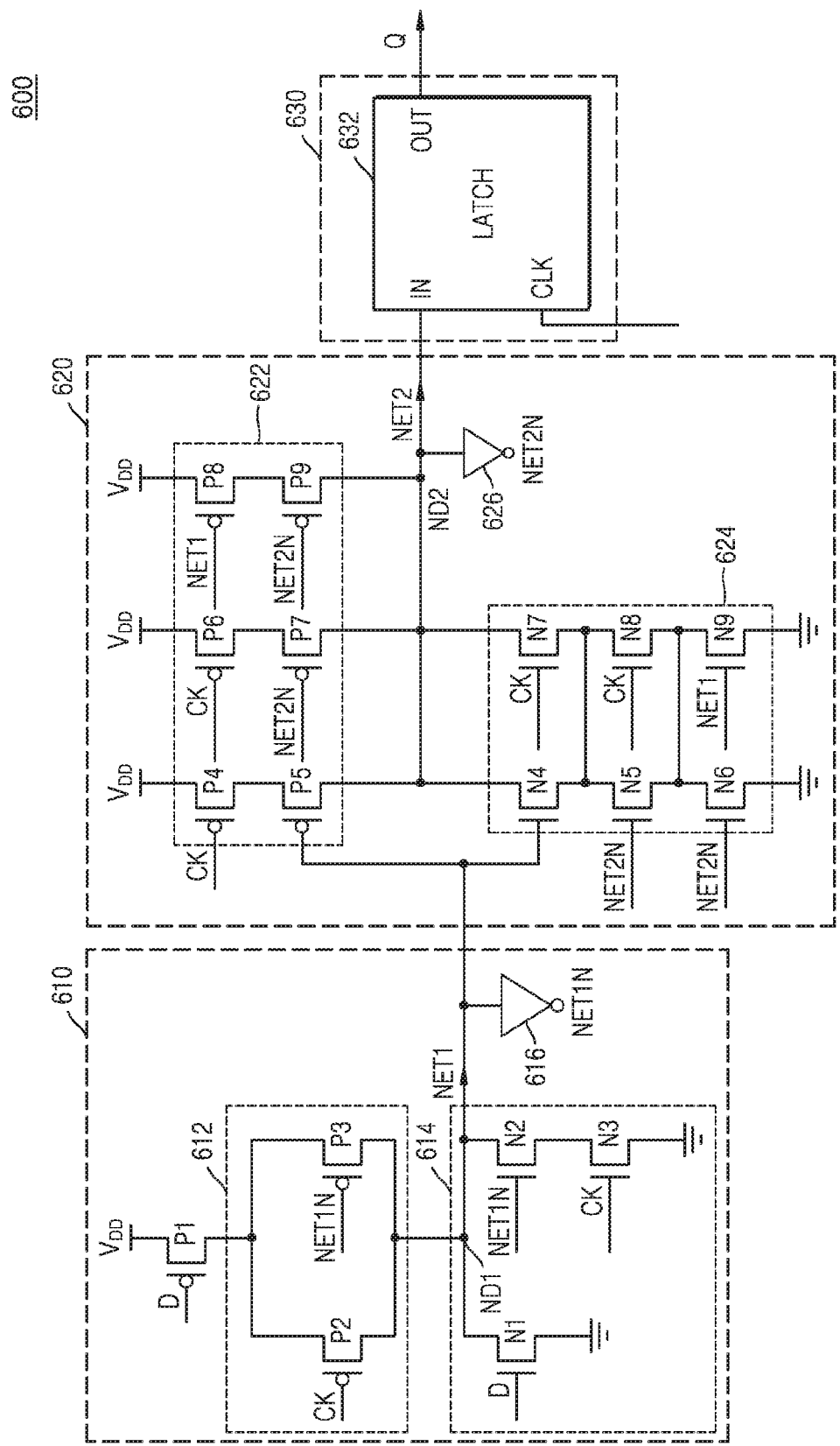
FIG. 7 is a circuit diagram illustrating a flip-flop according to an embodiment in detail.

FIG. 7 is a circuit diagram illustrating a flip-flop according to an embodiment in detail.

Referring to FIG. 7, a flip-flop 600 may include a first stage circuit 610, a second stage circuit 620, and a third stage circuit 630. The first stage circuit 610 may correspond to the first stage circuit 510b of FIG. 6, and the second stage circuit 620 may correspond to the second stage circuit 420 of FIG. 4A.

By this configuration, when performing a latch operation for the first data signal D, the flip-flop 600 may prevent the first node ND1 and the second node ND2 from floating and prevent an unnecessary precharge operation for the second node ND2, thereby reducing the power consumption of the flip-flop 600.

FIGS. 8A to 8D are diagrams illustrating various modifications of the second stage circuit of FIG. 7.

Figure 8A:
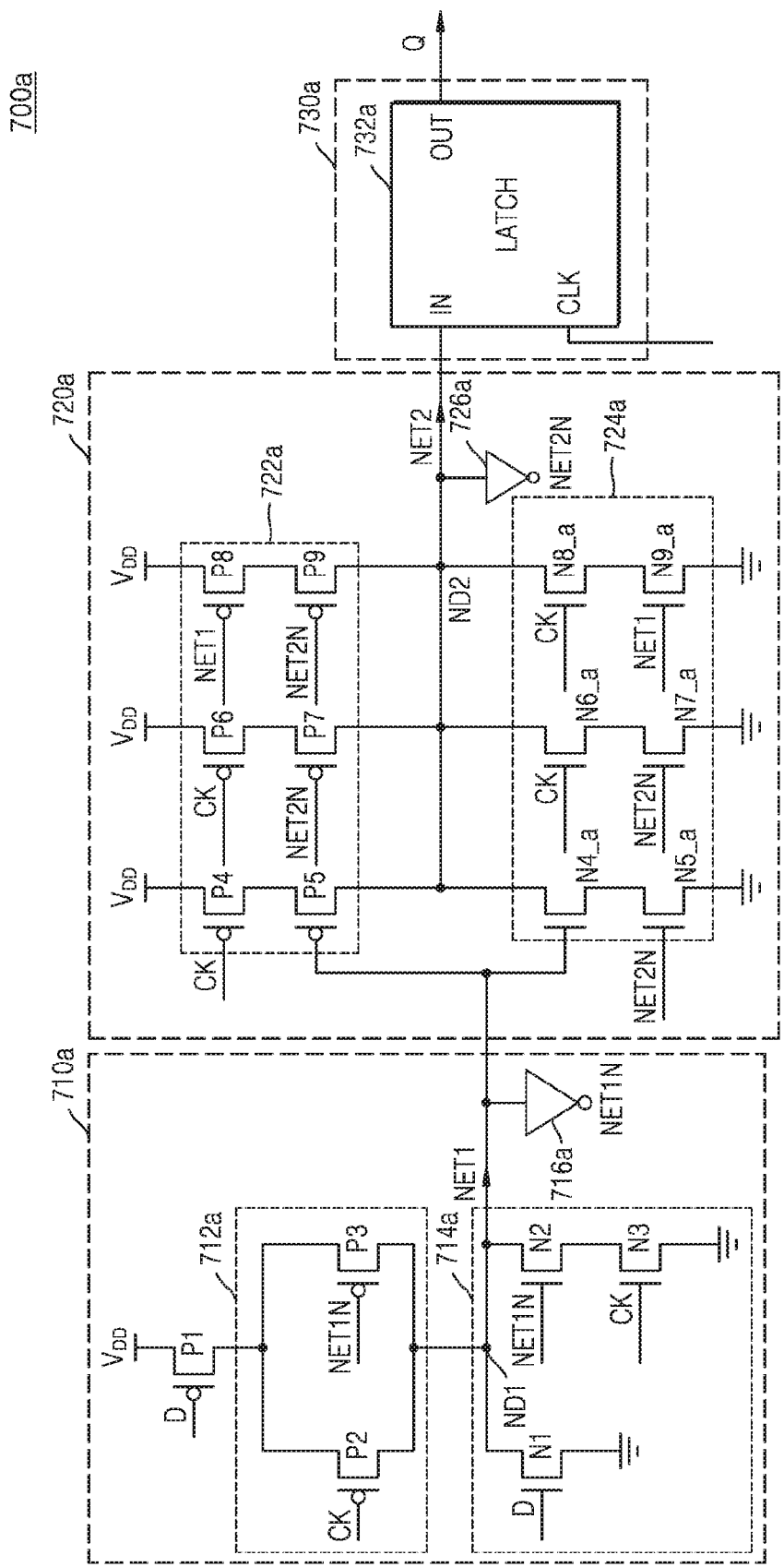
FIGS. 8A to 8D are diagrams illustrating various modifications of a second stage circuit of FIG. 7.

Referring to FIG. 8A, a flip-flop 700a may include a first stage circuit 710a, a second stage circuit 720a, and a third stage circuit 730a. Hereinafter, components different from those of the flip-flop 600 shown in FIG. 7 will be mainly described. A second pull-down circuit 724a of the second stage circuit 720a may include: a transistor N4_a and a transistor N9_a, which are controlled to be turned on/off by the first internal signal NET1; a transistor N6_a and a transistor N8_a, which are controlled to be turned on/off by the clock signal CK; and a transistor N5_a and a transistor N7_a, which are controlled to be turned on/off by the feedback signal NET2N. In this way, the second pull-down circuit 724a may form a current path between the second node ND2 and the ground GND using the transistor N4_a and the transistor N5_a, form a current path between the second node ND2 and the ground GND using the transistor N6_a and the transistor N7_a, and form a current path between the second node ND2 and the ground GND using the transistor N8_a and the transistor N9_a.

Figure 8B:
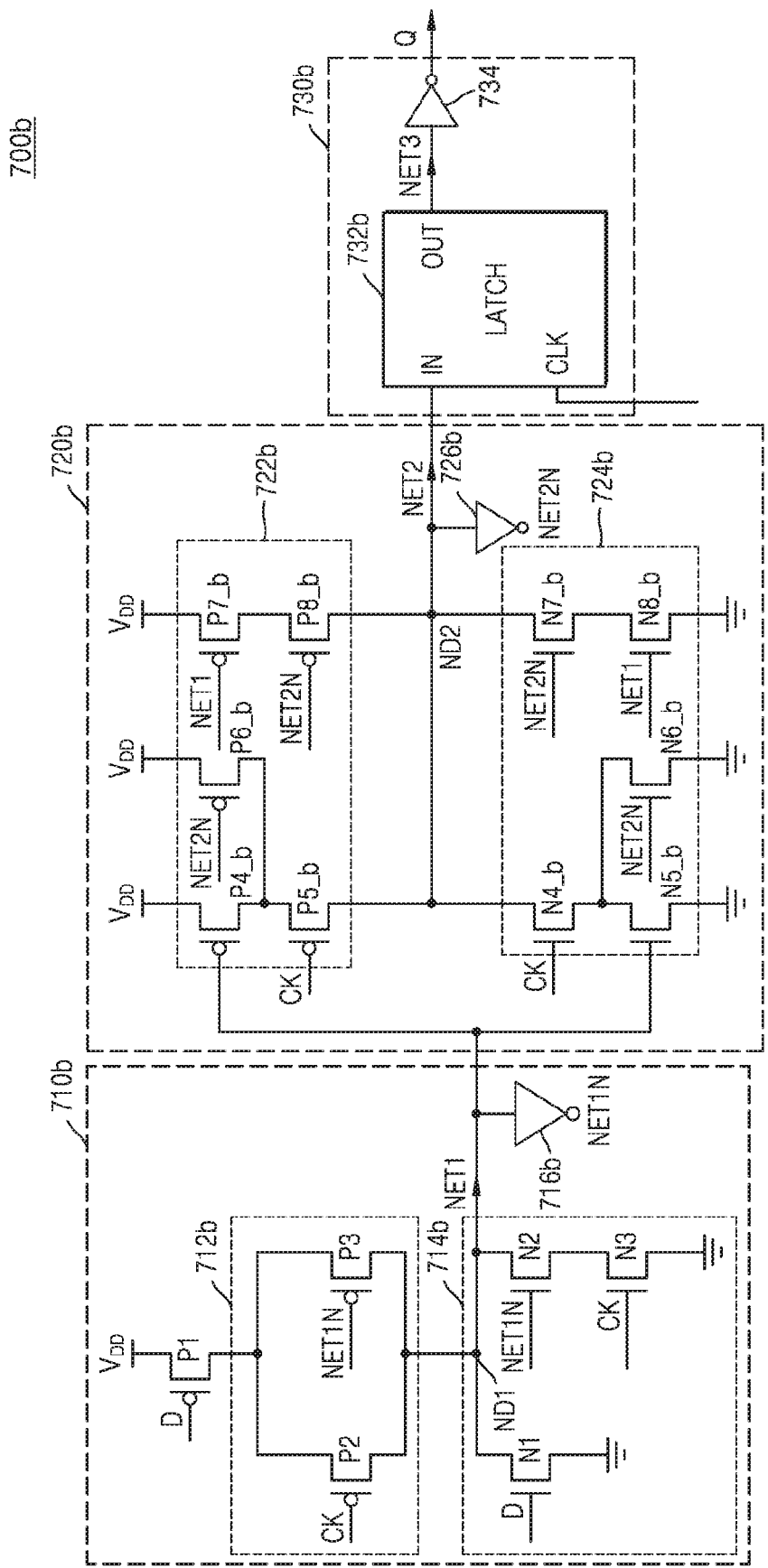

Referring to FIG. 8B, a second pull-up circuit 722b and a second pull-down circuit 724b of a second stage circuit 720b may include transistors that are less in number compared to the transistors included in the second pull-up circuit 722a and the second pull-down circuit 724a of FIG. 8A, and may form various current paths through these transistors.

The second pull-up circuit 722b may include: a transistor P4_b and a transistor P7_b, which are controlled to be turned on/off by the first internal signal NET1; a transistor P5_b controlled to be turned on/off by the clock signal CK; and a transistor P6_b and a transistor P8_b, which are controlled to be turned on/off by the feedback signal NET2N. In addition, a source of the transistor P6_b may be connected to a drain of the transistor P5_b.

The second pull-down circuit 724b may include: a transistor N5_b and a transistor N8_b, which are controlled to be turned on/off by the first internal signal NET1; a transistor N4_b controlled to be turned on/off by the clock signal CK; and a transistor N6_b and a transistor N7_b, which are controlled to be turned on/off by the feedback signal NET2N. In addition, a source of the transistor N4_b may be connected to a drain of the transistor N6_b.

Figure 8C:
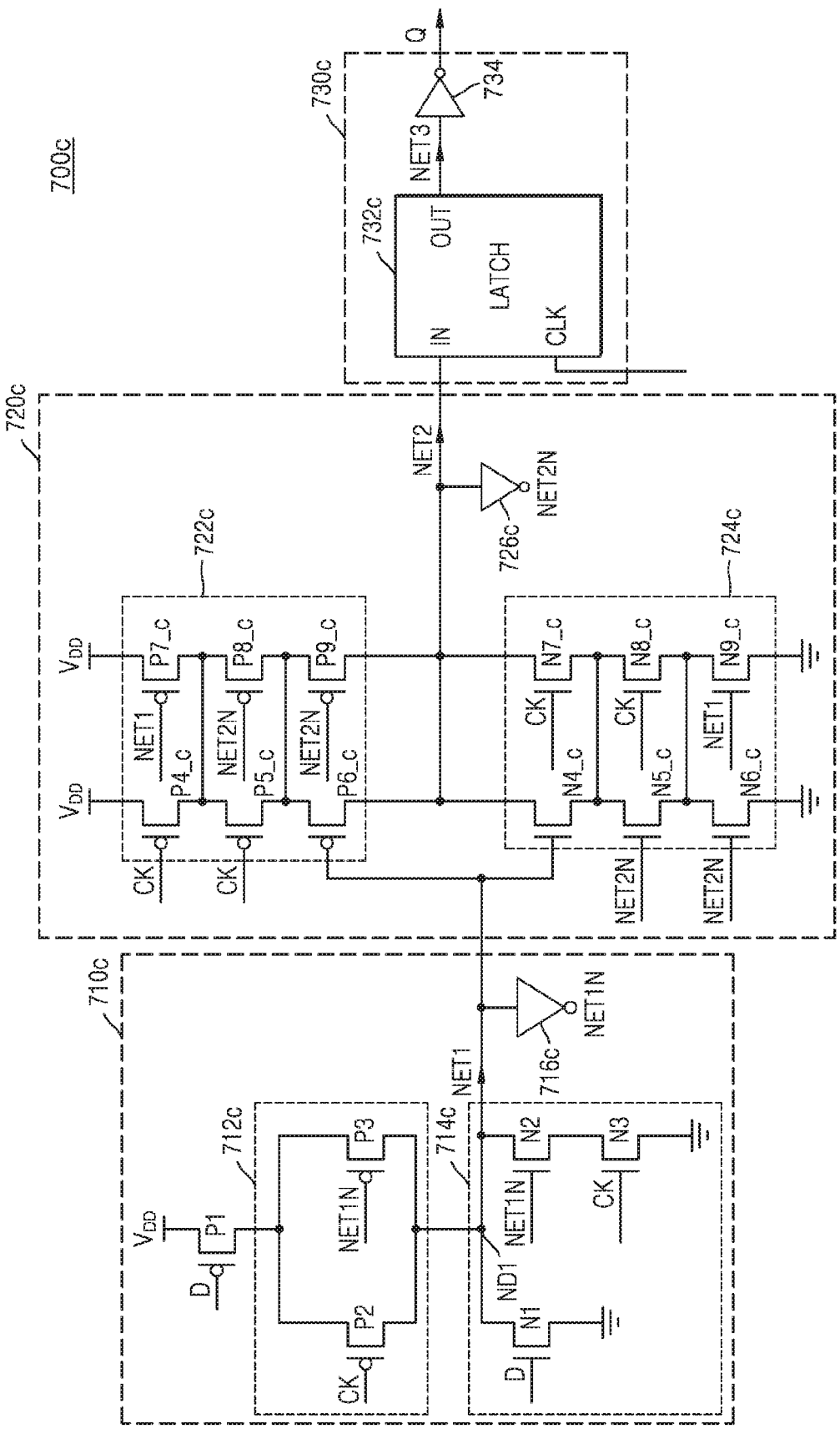

Referring to FIG. 8C, a second pull-up circuit 722c of a second stage circuit 720c may have a different connection configuration from the second pull-up circuits 722a and 722b of FIGS. 8A and 8B, thereby forming various current paths. The second pull-up circuit 722c may include: a transistor P6_c and a transistor P7_c, which are controlled to be turned on/off by the first internal signal NET1; a transistor P4_c and a transistor P5_c, which are controlled to be turned on/off by the clock signal CK; and a transistor P8_c and a transistor P9_c, which are controlled to be turned on/off by the feedback signal NET2N. A source of the transistor P7_c may be connected to a drain of the transistor P5_c, and a source of the transistor P4_c may be connected to a drain of the transistor P8_c. A source of the transistor P5_c may be connected to a drain of the transistor P9_c. A source of the transistor P8_c may be connected to a drain of the transistor P6_c.

Figure 8D:
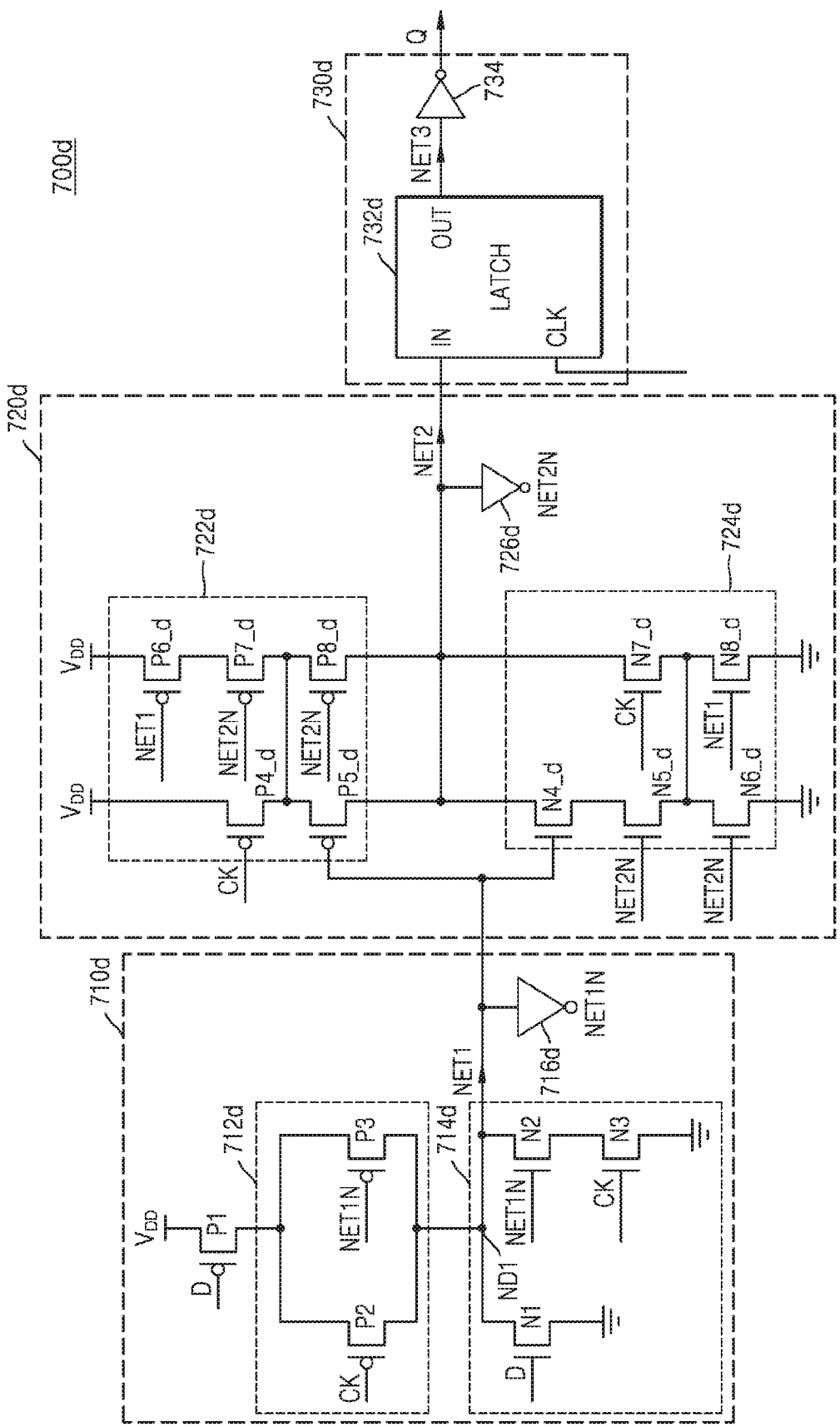

Referring to FIG. 8D, a second pull-up circuit 722d and a second pull-down circuit 724d of a second stage circuit 720d may include transistors that are less in number compared to the transistors included in the second pull-up circuit 722c and the second pull-down circuit 724c of FIG. 8C, respectively. The second pull-up circuit 722d and the second pull-down circuit 724d may form various current paths through these transistors. The second pull-up circuit 722d may include: a transistor P5_d and a transistor P6_d, which are controlled to be turned on/off by the first internal signal NET1; a transistor P4_d controlled to be turned on/off by the clock signal CK; and a transistor P7_d and a transistor P8_d, which are controlled to be turned on/off by the feedback signal NET2N. A source of the transistor P7_d may be connected to a drain of the transistor P5_d, and a source of the transistor P4_d may be connected to a drain of the transistor P8_d.

The second pull-down circuit 724d may include: a transistor N4_d and a transistor N8_d, which are controlled to be turned on/off by the first internal signal NET1; a transistor N7_d controlled to be turned on/off by the clock signal CK; and a transistor N5_d and a transistor N6_d, which are controlled to be turned on/off by the feedback signal NET2N. A source of the transistor N7_d may be connected to a drain of the transistor N6_d, and a source of the transistor N5_d may be connected to a drain of the transistor N8_d.

Figure 9:
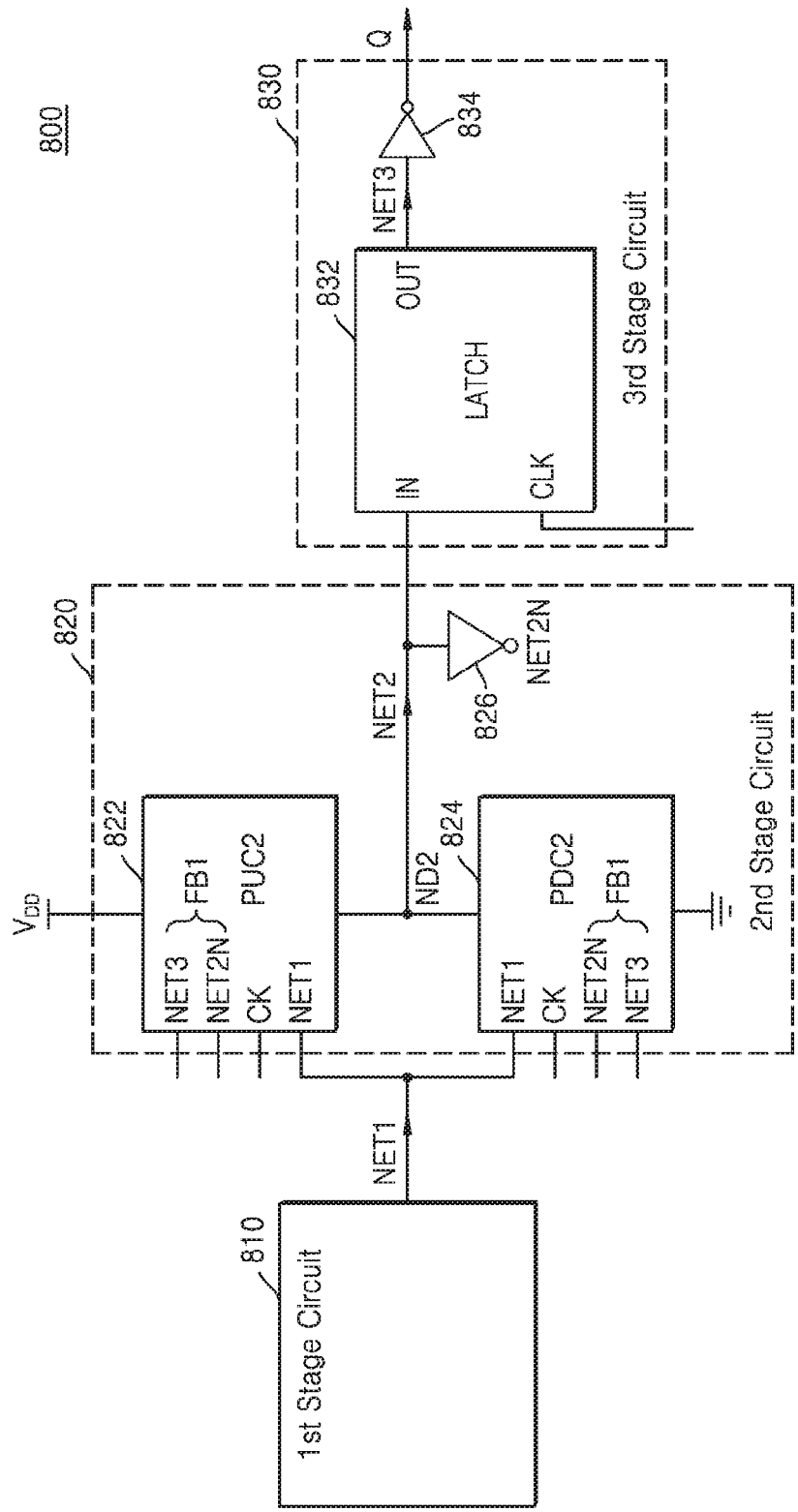
FIG. 9 is a block diagram of a flip-flop according to a further embodiment.

FIG. 9 is a block diagram of a flip-flop according to a further embodiment.

Referring to FIG. 9, a flip-flop 800 may include a first stage circuit 810, a second stage circuit 820, and a third stage circuit 830. Hereinafter, a difference of the flip-flop 800 from the flip-flop 100b of FIG. 1B will be mainly described. The second stage circuit 820 of the flip-flop 800 of FIG. 9 may include a second pull-up circuit 822 and a second pull-down circuit 824. The second pull-up circuit 822 and the second pull-down circuit 824 may receive the first internal signal NET1, the clock signal CK, and the first feedback signal FB1. The first feedback signal FB1 may be generated based on a signal generated from the second stage circuit 820 and a signal generated from the third stage circuit 830. In an embodiment, the first feedback signal FB1 may include a signal NET2N, which is generated based on the second internal signal NET2 generated through the second node ND2 of the second stage circuit 820, and the third internal signal NET3 generated from a latch circuit 832 of the third stage circuit 830. However, this is merely an example, and the first feedback signal is not limited thereto. The first feedback signal FB1 may be generated based only on a signal generated from the third stage circuit 830. The second pull-up circuit 822 may prevent an unnecessary precharge operation for the second node ND2 when generating the second internal signal NET2, based on the first feedback signal FB1. In addition, the second pull-up circuit 822 and the second pull-down circuit 824 may prevent the second node ND2 from floating, based on the feedback signal FB1. Descriptions regarding this have been made above and thus will be omitted.

FIGS. 10A to 10F are circuit diagrams illustrating various embodiments of the flip-flop shown in FIG. 9.

Figure 10A:
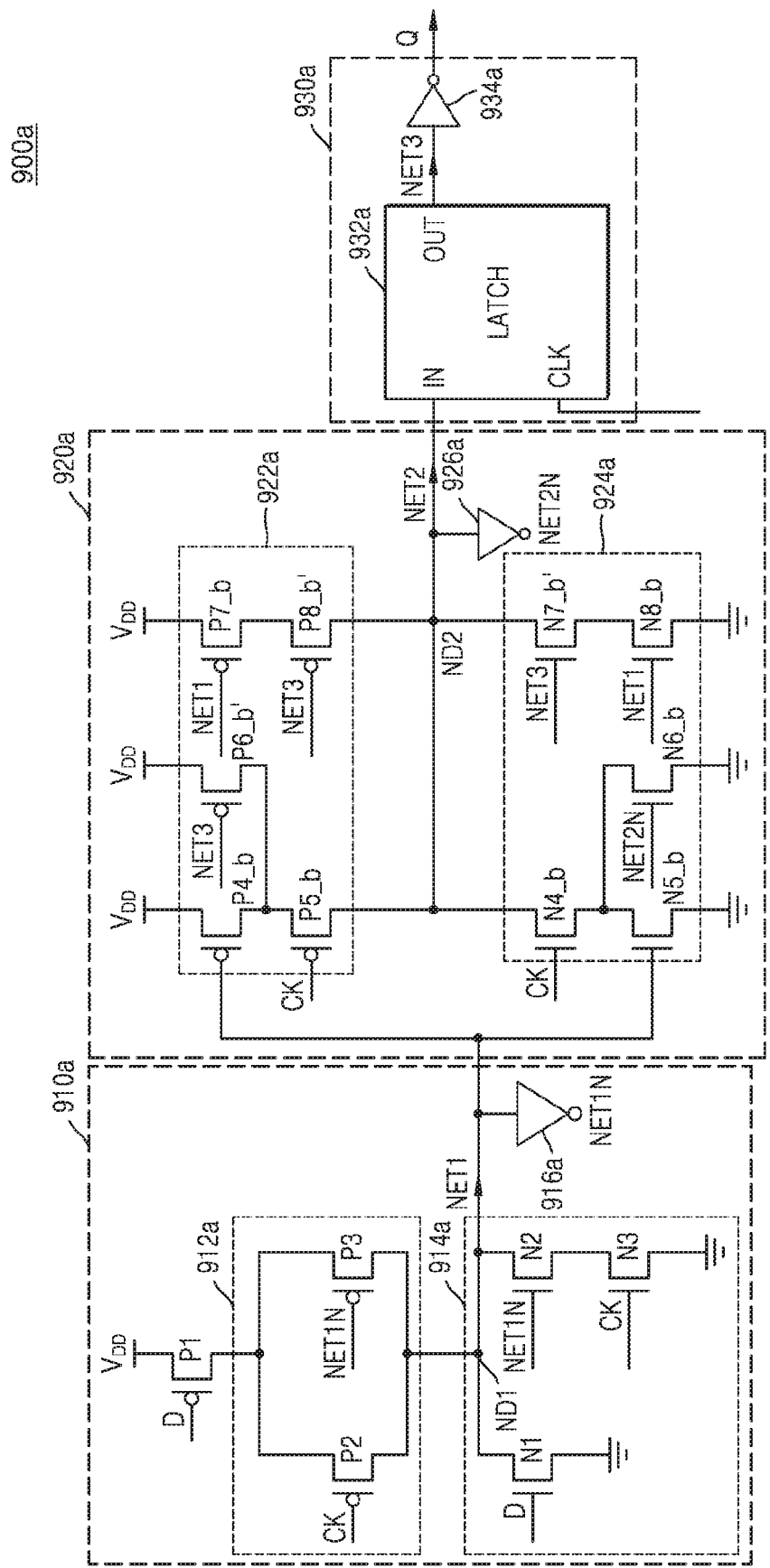
FIGS. 10A to 10F are circuit diagrams illustrating various embodiments of the flip-flop shown in FIG. 9.

Referring to FIG. 10A, a configuration of a flip-flop 900a may correspond to the configuration of the flip-flop 700b of FIG. 8B. However, unlike the second pull-up circuit 722b of FIG. 8B, a second pull-up circuit 922a may not include a transistor receiving an inverted second internal signal NET2N. In an embodiment, a transistor P6_b' and a transistor P8_b' of the second pull-up circuit 922a may receive the third internal signal NET3 and be controlled to be turned on/off by the third internal signal NET3. In addition, unlike in the second pull-down circuit 724b of FIG. 8B, a transistor N7_b' of a second pull-down circuit 924a may receive the third internal signal NET3 and be controlled to be turned on/off by the third internal signal NET3.

Figure 10B:
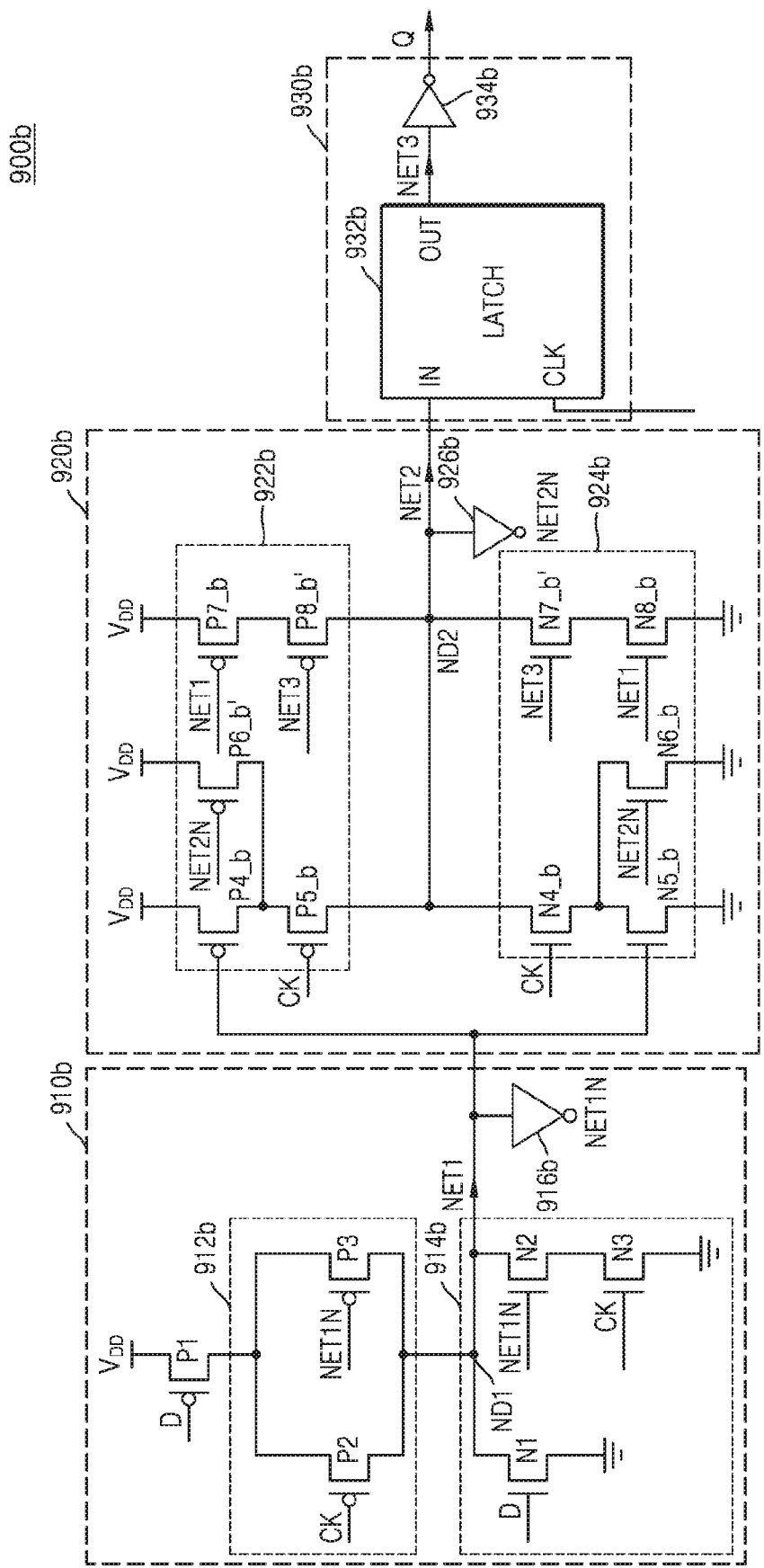

Referring to FIG. 10B, a configuration of a flip-flop 900b may correspond to the configuration of the flip-flop 900a of FIG. 10A. However, unlike the second pull-up circuit 922a of FIG. 10A, a second pull-up circuit 922b may include a transistor receiving the inverted second internal signal NET2N, and a transistor receiving the third internal signal NET3. In an embodiment, a transistor P6_b' of the second pull-up circuit 922b may receive the inverted second internal signal NET2N and be controlled to be turned on/off by the inverted second internal signal NET2N. A transistor P8_b' of the second pull-up circuit 922b may receive the third internal signal NET3 and be controlled to be turned on/off by the third internal signal NET3.

Figure 10C:
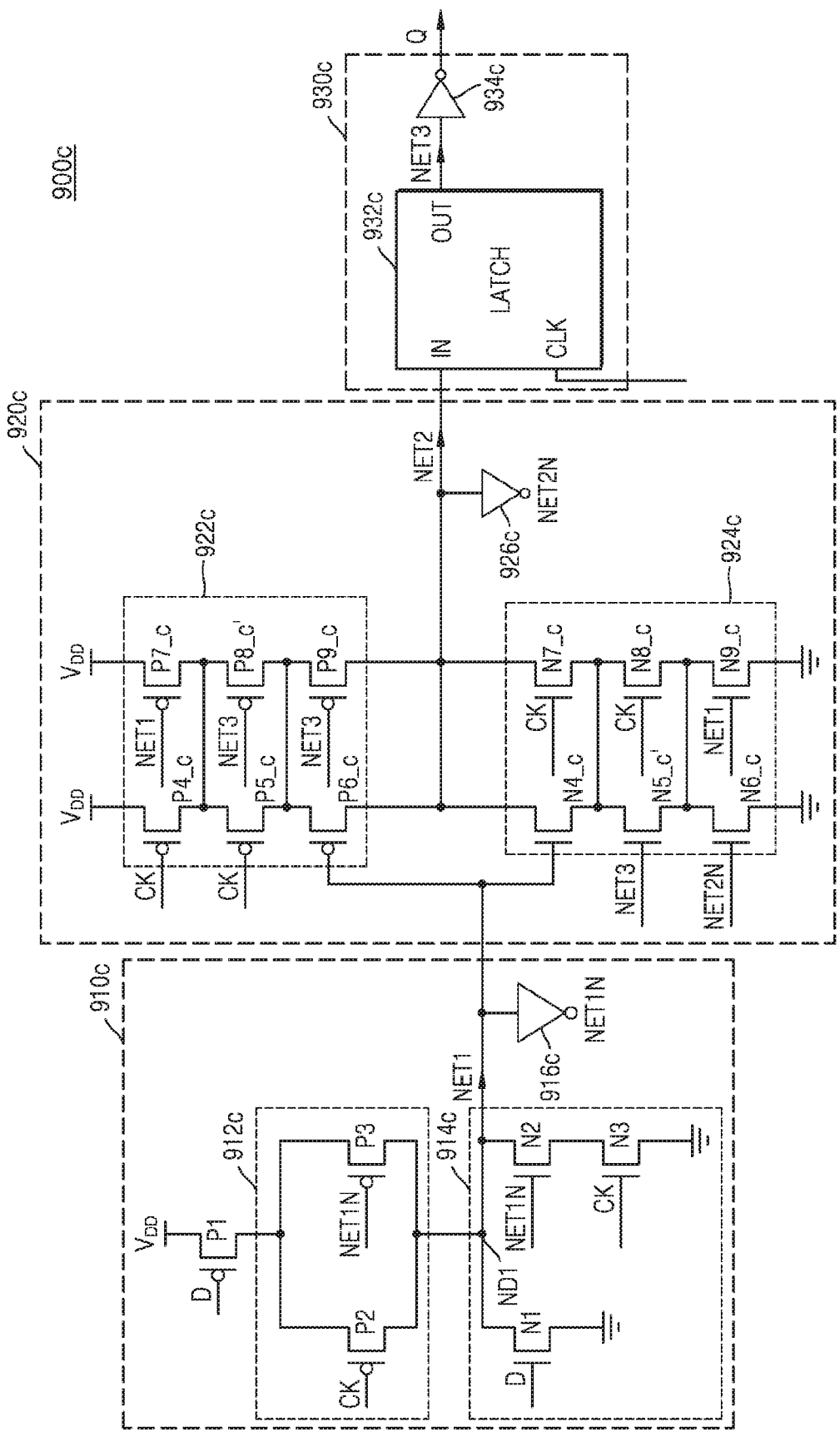

Referring to FIG. 10C, a configuration of a flip-flop 900c may correspond to the configuration of the flip-flop 700c of FIG. 8C. However, unlike the second pull-up circuit 722c of FIG. 8C, a second pull-up circuit 922c may not include a transistor receiving the inverted second internal signal NET2N. In an embodiment, a transistor P8_c' and a transistor P9_c' of the second pull-up circuit 922c may receive the third internal signal NET3 and be controlled to be turned on/off by the third internal signal NET3. In addition, unlike in the second pull-down circuit 724c of FIG. 8C, a transistor N5_c' of a second pull-down circuit 924c may receive the third internal signal NET3 and be controlled to be turned on/off by the third internal signal NET3.

Figure 10D:
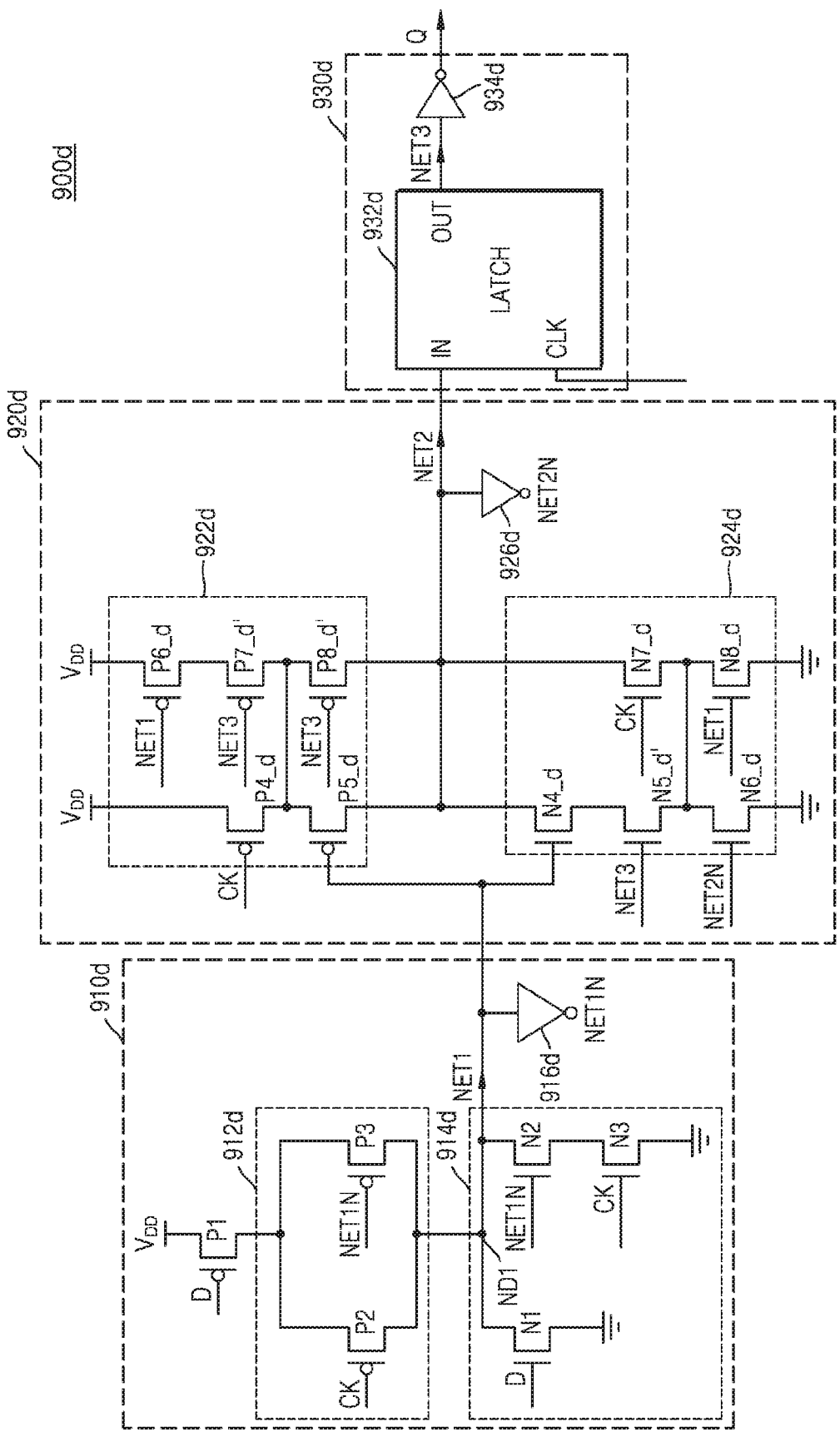

Referring to FIG. 10D, a configuration of a flip-flop 900d may correspond to the configuration of the flip-flop 700d of FIG. 8D. However, unlike the second pull-up circuit 722d of FIG. 8D, a second pull-up circuit 922d may not include a transistor receiving the inverted second internal signal NET2N. In an embodiment, a transistor P7_d' and a transistor P8_d' of the second pull-up circuit 922d may receive the third internal signal NET3 and be controlled to be turned on/off by the third internal signal NET3. In addition, unlike in the second pull-down circuit 724d of FIG. 8D, a transistor N5_d' of a second pull-down circuit 924d may receive the third internal signal NET3 and be controlled to be turned on/off by the third internal signal NET3.

Figure 10E:
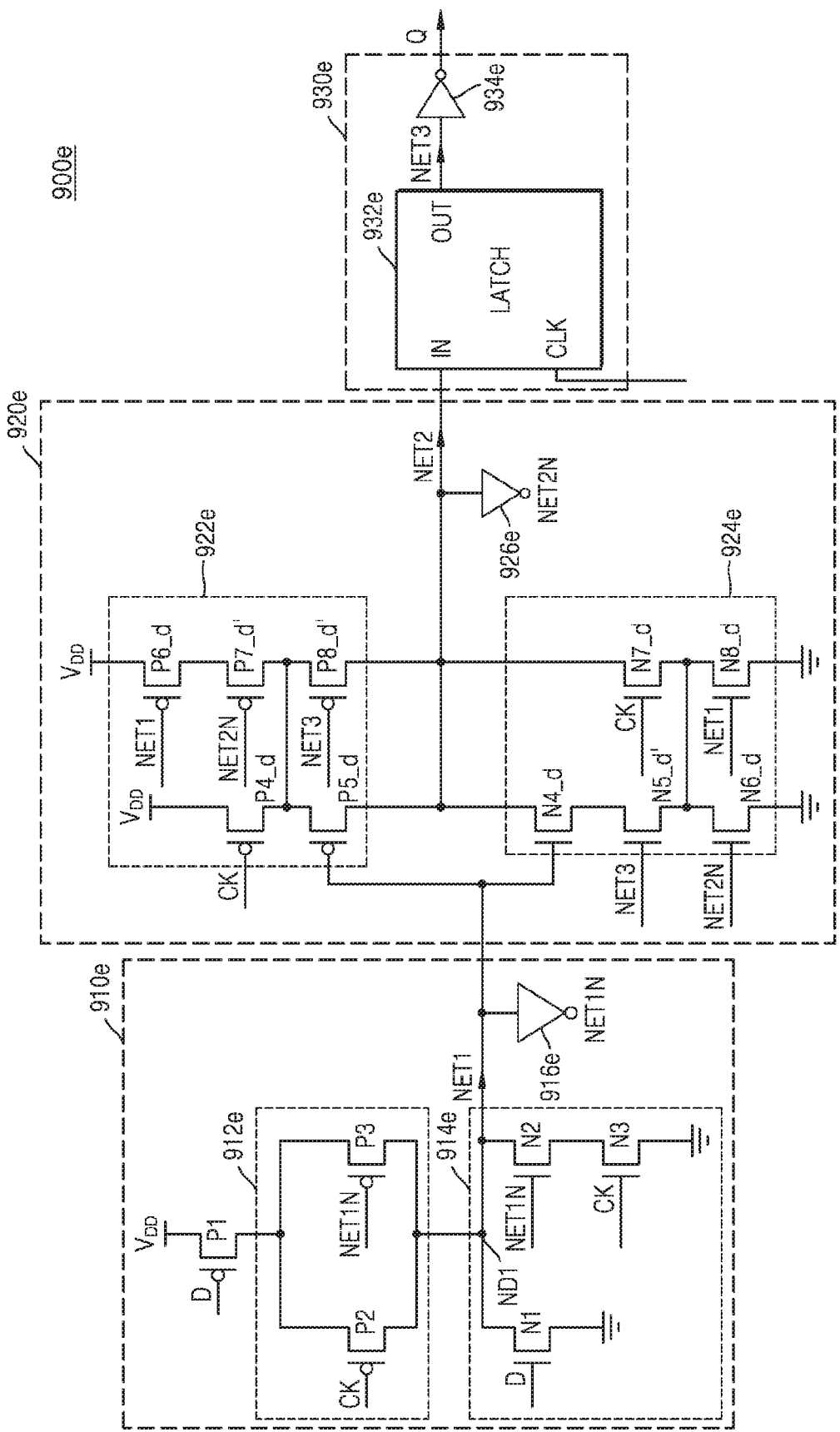

Referring to FIG. 10E, a configuration of a flip-flop 900e may correspond to the configuration of the flip-flop 900d of FIG. 10D. However, unlike the second pull-up circuit 922d of FIG. 10D, a second pull-up circuit 922e may include a transistor receiving the inverted second internal signal NET2N and a transistor receiving the third internal signal NET3. In an embodiment, a transistor P7_d' of the second pull-up circuit 922e may receive the inverted second internal signal NET2N and be controlled to be turned on/off by the inverted second internal signal NET2N. A transistor P8_d' of the second pull-up circuit 922e may receive the third internal signal NET3 and be controlled to be turned on/off by the third internal signal NET3.

Figure 10F:
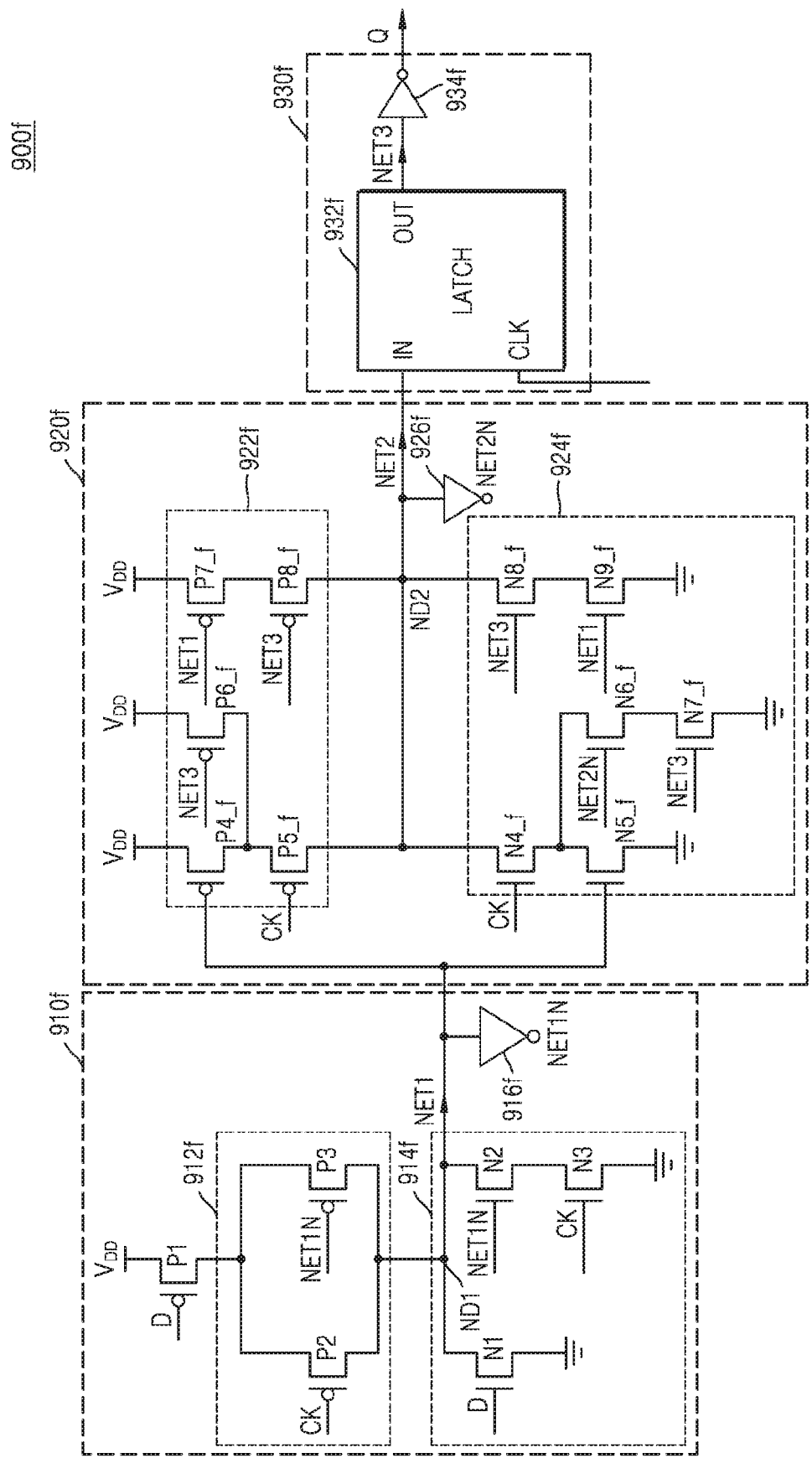

Referring to FIG. 10F, a configuration of a flip-flop 900f may correspond to the configuration of the flip-flop 900a of FIG. 10A. However, unlike the second pull-down circuit 924d of FIG. 10D, a second pull-down circuit 924f may include: a transistor N5_f and a transistor N9_f, which are controlled to be turned on/off by the first internal signal NET1; a transistor N4_f controlled to be turned on/off by the clock signal CK; a transistor N6_f controlled to be turned on/off by the inverted second internal signal NET2N; and a transistor N7_f and a transistor N8_f, which are controlled to be turned on/off by the third internal signal NET3. A source of the transistor N4_f may be connected to a drain of the transistor N6_f.

FIG. 11A shows Karnaugh maps illustrating the relationship between signals relating to a second stage circuit of a flip-flop according to an embodiment, and FIG. 11B shows relational expressions for a second internal signal derived from the Karnaugh maps of FIG. 11A.

As described above, a second stage circuit may include a second pull-up circuit PUC2 and a second pull-down circuit PDC2. The second pull-up circuit PUC2 may form a current path between a power supply and a second node, based on the first internal signal NET1, the clock signal CK, and the feedback signals NET2N and NET3, thereby generating the second internal signal NET2 at the high level. The second pull-down circuit PDC2 may form a current path between the second node and a ground, based on the first internal signal NET1, the clock signal CK, and the feedback signals NET2N and NET3, thereby generating the second internal signal NET2 at the low level.

Referring to FIG. 11A, to satisfy operations of the second pull-up circuit PUC2 and the second pull-down circuit PDC2 of the second stage circuit, the relationship between signals NET1, CK, NET2N, and NET3 relating to the second pull-up circuit PUC2 may be established, like in a logic function in the form of a truth table shown in a first Karnaugh map M_PUC2. In addition, the relationship between the signals NET1, CK, NET2N, and NET3 relating to the second pull-down circuit PDC2 may be established, like in a logic function in the form of a truth table shown in a second Karnaugh map M_PDC2. However, the Karnaugh maps M_PUC2 and M_PDC2 shown in FIG. 11A are merely examples, without being limited thereto, and may vary depending upon a configuration of the second stage circuit.

Referring to FIG. 11B, in an embodiment, as a result of minimizing the logic function of the first Karnaugh map M_PUC2 of FIG. 11A, the second pull-up circuit PUC2 may be realized into a circuit diagram corresponding to a first expression ①, and furthermore, may be realized into a circuit diagram corresponding to an expression including the first expression ① and at least one of second to fourth expressions ② to ④.

In addition, as a result of minimizing the logic function of the second Karnaugh map M_PDC2 of FIG. 11A, the second pull-down circuit PDC2 may be realized into a circuit diagram corresponding to a fifth expression ⑤, and furthermore, may be realized into a circuit diagram corresponding to an expression including the fifth expression ⑤ and at least one of sixth to ninth expressions ⑥ to ⑨.

Figure 12:
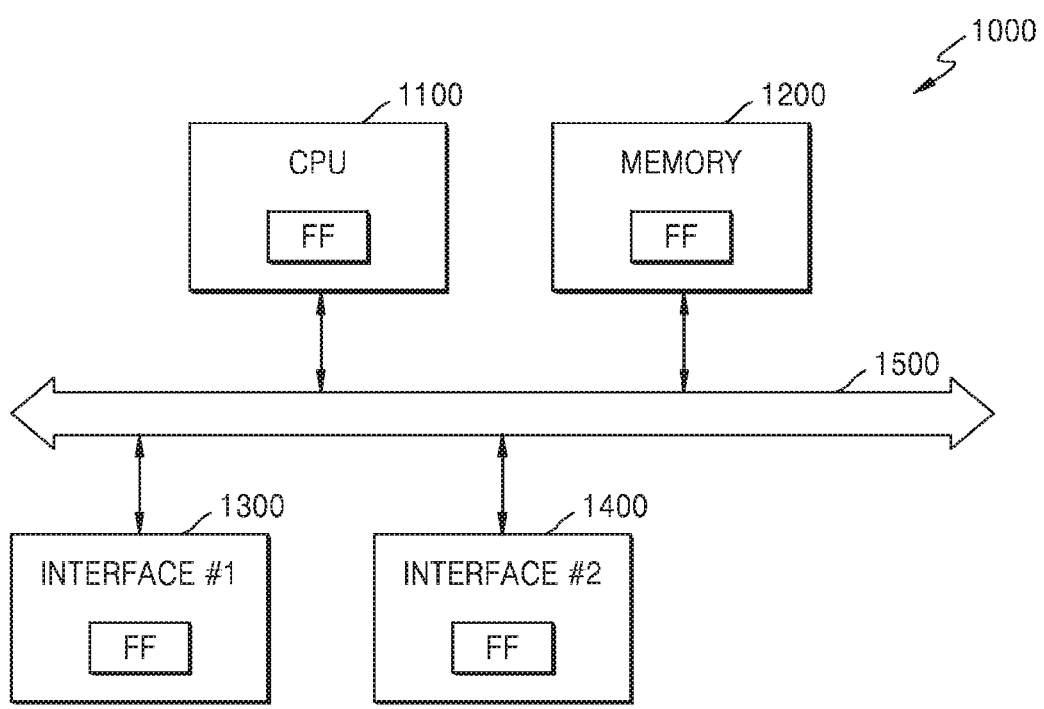
FIG. 12 is a schematic block diagram of a semiconductor system including a flip-flop according to an embodiment.

FIG. 12 is a schematic block diagram of a semiconductor system including a flip-flop according to an embodiment.

A semiconductor system 1000 may be realized as a PC, a portable computer, a smart phone, a digital TV, or a home automation device.

The semiconductor system 1000 may include a CPU 1100 and memory 1200, which are connected to each other through a system bus 1500. The CPU 1100 may control overall operations of the memory 1200. The CPU 1100 may include a flip-flop FF latching a signal processed by the CPU 1100, and a logic circuit controlling the flip-flop FF. The memory 1200 may be realized as non-volatile memory, for example, ROM, which may store a program code capable of controlling operations of the CPU 1100, or may be realized as volatile memory, for example, DRAM, which may store data. The memory 1200 includes a flip-flop FF latching data accessed by the memory 1200, and a logic circuit (not shown) controlling the flip-flop FF. According to an embodiment, the semiconductor system 1000 may further include a first interface 1300. The first interface 1300 may be an input/output interface. The input/output interface may be an output device such as a monitor or a printer, a pointing device such as a touchpad or a computer mouse, or an input device such as a keypad or a keyboard.

The first interface 1300 includes a flip-flop latching data, which is input and output by the first interface 1300, and a logic circuit controlling the flip-flop. According to an embodiment, the semiconductor system 1000 may further include a second interface 1400. The second interface 1400 may be a communication interface for communicating with the outside of the semiconductor system 1000. For example, the communication interface may be an RF chip. The second interface 1400 includes a flip-flop latching data, which is transmitted and received by the second interface 1400, and a logic circuit controlling the flip-flop.

The flip-flops according to the present disclosure, which have been described with reference to FIGS. 1 to 11, may be applied to the flip-flops included in the CPU 1100, the memory 1200, and the first and second interfaces 1300 and 1400.

While the concepts described herein have been particularly shown and described with reference to embodiments thereof, it will be understood that various changes in form and details may be made therein without departing from the spirit and scope of the following claims.

What is claimed is:

1. A flip-flop which generates a first feedback signal using a signal generated inside the flip-flop, the flip-flop comprising:
   a first stage circuit that receives a first data signal and a clock signal and that generates a first internal signal through a first node;
   a second stage circuit that receives the first internal signal, the clock signal, and the first feedback signal and that generates a second internal signal through a second node; and
   a third stage circuit that generates a second data signal by latching the second internal signal when the clock signal is at a first level, using the second internal signal and the clock signal,
   wherein the second stage circuit cuts off at least one first current path between the second node and a power supply, based on the first feedback signal, when the clock signal is at a second level, and
   wherein the second stage circuit forms a second current path between the second node and the power supply, based on the first internal signal and the clock signal.

2. The flip-flop according to claim 1,
   wherein the second stage circuit cuts off the at least one first current path and the second current path, such that the second node is kept discharged, when:
   the second node is discharged;
   the first internal signal is constant at one of the first level and the second level; and
   the clock signal transits from the first level to the second level.

3. The flip-flop according to claim 2, wherein the second stage circuit forms the second current path, such that the second node is precharged by the second current path, when:
   the second node is discharged;
   the first internal signal is constant at the other one of the first level and the second level; and
   the clock signal transits from the first level to the second level.

4. The flip-flop according to claim 1,
   wherein the first feedback signal comprises a signal generated using the second internal signal.

5. The flip-flop according to claim 1, wherein the second stage circuit comprises:
   a pull-up circuit connecting the power supply to the second node; and
   a pull-down circuit connecting a ground to the second node, and
   the pull-up circuit comprises:
   at least one first PMOS transistor controlled to be turned on/off by receiving the clock signal;
   at least one second PMOS transistor controlled to be turned on/off by receiving the first internal signal; and
   at least one third PMOS transistor controlled to be turned on/off by receiving the first feedback signal, and
   the pull-down circuit comprises:
   at least one first NMOS transistor controlled to be turned on/off by receiving the clock signal;
   at least one second NMOS transistor controlled to be turned on/off by receiving the first internal signal; and
   at least one third NMOS transistor controlled to be turned on/off by receiving the first feedback signal.

6. The flip-flop according to claim 1,
   wherein the second stage circuit comprises at least one switch device controlled to be turned on/off based on the first feedback signal, and cuts off the at least one first current path by turning off the switch device.

7. The flip-flop according to claim 1,
   wherein the first stage circuit further receives a second feedback signal, comprises at least one switch device controlled to be turned on/off based on the second feedback signal, and controls the switch device such that the first node does not float by grounding the first node or connecting the first node to the power supply, based on the second feedback signal.

8. A flip-flop which generates a first feedback signal using a signal generated inside the flip-flop, the flip-flop comprising:
   a first stage circuit that receives a first data signal and a clock signal and that generates a first internal signal through a first node;
   a second stage circuit that receives the first internal signal, the clock signal, and the first feedback signal and that generates a second internal signal through a second node; and
   a third stage circuit that generates a second data signal by latching the second internal signal when the clock signal is at a first level, using the second internal signal and the clock signal,
   wherein the second stage circuit cuts off at least one first current path between the second node and a power supply, based on the first feedback signal, when the clock signal is at a second level, and
   wherein the second stage circuit comprises:
   a pull-up circuit connecting the power supply to the second node; and
   a pull-down circuit connecting a ground to the second node, the pull-up circuit comprises:
- at least one first PMOS transistor controlled to be turned on/off by receiving the clock signal;
- at least one second PMOS transistor controlled to be turned on/off by receiving the first internal signal; and
- at least one third PMOS transistor controlled to be turned on/off by receiving the first feedback signal, and the pull-down circuit comprises:
- at least one first NMOS transistor controlled to be turned on/off by receiving the clock signal;
- at least one second NMOS transistor controlled to be turned on/off by receiving the first internal signal; and
- at least one third NMOS transistor controlled to be turned on/off by receiving the first feedback signal.

9. The flip-flop according to claim 8,
wherein the second stage circuit forms a second current path between the second node and the power supply, based on the first internal signal and the clock signal.

10. The flip-flop according to claim 9,
wherein the second stage circuit cuts off the at least one first current path and the second current path, such that the second node is kept discharged, when:
the second node is discharged;
the first internal signal is constant at one of the first level and the second level; and
the clock signal transits from the first level to the second level.

11. The flip-flop according to claim 10, wherein the second stage circuit forms the second current path, such that the second node is precharged by the second current path, when:
the second node is discharged;
the first internal signal is constant at the other one of the first level and the second level; and
the clock signal transits from the first level to the second level.

12. The flip-flop according to claim 8,
wherein the first feedback signal comprises a signal generated using the second internal signal.

13. The flip-flop according to claim 8,
wherein the second stage circuit cuts off the at least one first current path by turning off the at least one third PMOS transistor.

14. The flip-flop according to claim 8,
wherein the first stage circuit further receives a second feedback signal, comprises at least one switch device controlled to be turned on/off based on the second feedback signal, and controls the switch device such that the first node does not float by grounding the first node or connecting the first node to the power supply, based on the second feedback signal.

* * * * *